United States Patent [19]

Simpson et al.

[11] Patent Number: 5,536,622
[45] Date of Patent: *Jul. 16, 1996

[54] HYDRAZIDE COMPOUNDS USEFUL AS CO-DEVELOPERS FOR BLACK-AND-WHITE PHOTOTHERMOGRAPHIC ELEMENTS

[75] Inventors: Sharon M. Simpson, Lake Elmo, Minn.; Lori S. Harring, Hudson, Wis.

[73] Assignee: Minnesota Mining and Manufacturing Company, St. Paul, Minn.

[*] Notice: The term of this patent shall not extend beyond the expiration date of Pat. No. 5,512,411.

[21] Appl. No.: 520,291

[22] Filed: Aug. 28, 1995

Related U.S. Application Data

[62] Division of Ser. No. 369,730, Jan. 6, 1995.

[51] Int. Cl.$^6$ .............................. G03C 1/498; G03C 5/16
[52] U.S. Cl. ..................... 430/300; 430/348; 430/349; 430/350; 430/358; 430/617; 430/619
[58] Field of Search ..................... 430/348, 350, 430/617, 619, 349, 300, 357, 358, 363

[56] References Cited

U.S. PATENT DOCUMENTS

| | | | |
|---|---|---|---|
| 3,457,075 | 7/1969 | Morgan et al. | 96/67 |
| 3,782,949 | 1/1974 | Olivares et al. | 96/76 R |
| 3,839,049 | 10/1974 | Simons | 96/114.6 |
| 4,260,677 | 4/1981 | Winslow et al. | 430/618 |
| 4,735,884 | 4/1988 | Tsukahara et al. | 430/138 |
| 4,772,531 | 9/1988 | Tsukahara et al. | 430/138 |
| 4,798,790 | 1/1989 | Thomson et al. | 435/7 |
| 4,849,319 | 7/1989 | Inoue et al. | 430/264 |
| 4,891,295 | 1/1990 | Kakimi | 430/138 |
| 4,902,599 | 2/1990 | Yamamoto et al. | 430/138 |
| 4,920,034 | 4/1990 | Sasaoka et al. | 430/264 |
| 4,925,832 | 5/1990 | Hall et al. | 564/149 |
| 4,952,474 | 8/1990 | Tsukahara et al. | 430/138 |
| 4,970,132 | 11/1990 | Nakamura | 430/138 |
| 5,037,719 | 8/1991 | Nakamura | 430/138 |
| 5,070,132 | 12/1991 | Peccoux et al. | 524/492 |
| 5,196,288 | 5/1993 | Nakamura | 430/138 |
| 5,246,811 | 9/1993 | Higuchi | 430/138 |
| 5,393,654 | 2/1995 | Burrows et al. | 430/619 |

FOREIGN PATENT DOCUMENTS

0509740A1 4/1992 European Pat. Off. .

*Primary Examiner*—Thorl Chea
*Attorney, Agent, or Firm*—Gary L. Griswold; Walter N. Kirn; Gregory A. Evearitt

[57] ABSTRACT

Trityl hydrazides and formyl-phenyl hydrazines are useful as co-developers with hindered phenols in phothothermographic and thermographic elements. These co-developers have the formula:

$$R^1-(C=O)_n-NHNH-R^2$$

$R^1$ represents hydrogen and $R^2$ represents an aryl or substituted aryl group; or, $R^1$ represents hydrogen, alkyl and alkenyl groups of up to 20 carbon atoms; alkoxy, thioalkoxy, or amido groups of up to 20 carbon atoms; aryl, alkaryl, or aralkyl groups of up to 20 carbon atoms; aryloxy, thioaryloxy, or anilino groups of up to 20 carbon atoms; aliphatic or aromatic heterocyclic ring groups containing up to 6 ring atoms; carbocyclic ring groups comprising up to 6 ring carbon atoms; or fused ring or bridging groups comprising up to 14 ring atoms; and $R^2$ represents a trityl group.

The photothermographic and thermographic elements in the present invention may be used as a photomask in a process where there is a subsequent exposure of an ultraviolet or short wavelength visible radiation sensitive imageable medium.

8 Claims, No Drawings

HYDRAZIDE COMPOUNDS USEFUL AS CO-DEVELOPERS FOR BLACK-AND-WHITE PHOTOTHERMOGRAPHIC ELEMENTS

This is a division of application Ser. No. 08/369,730 filed Jan. 6, 1995.

BACKGROUND OF THE INVENTION

1. Field of the Invention

Trityl hydrazides and formyl-phenyl hydrazines are useful as co-developers with hindered phenol developers to produce an ultra high contrast black-and-white photothermographic and thermographic elements.

2. Background of the Art

The increasing availability and use of semiconductor light sources and particularly laser diodes which emit in the visible and particularly in the red and near infrared region of the electromagnetic spectrum, have led to the need for photo-thermographic materials for medical diagnostic and graphic arts use that have the ability to be efficiently exposed by laser imagesetters, light emitting diodes, or laser imagers and which have the ability to form sharp images of high resolution and sharpness. In addition, semiconductor light sources have allowed the design of compact automated equipment which increases the productivity of the imaging process, especially in medical diagnostic and graphic arts fields. The goal of photo-thermographic elements is to eliminate the use of wet processing chemicals and to provide a simple, environmentally friendly, thermal system to the customer.

Silver halide-containing, photothermographic imaging materials (i.e., heat-developable photographic elements) processed with heat, and without liquid development, have been known in the art for many years. These materials are also known as "dry silver" compositions or emulsions and generally comprise a support having coated thereon: (a) a photosensitive material that generates silver atoms when irradiated; (b) a non-photosensitive, reducible silver source; (c) a reducing agent (i.e., a developer) for silver ion, for example the silver ion in the non-photosensitive, reducible silver source; and (d) a binder.

The photosensitive material is generally photographic silver halide which must be in catalytic proximity to the non-photosensitive, reducible silver source. Catalytic proximity requires an intimate physical association of these two materials so that when silver atoms (also known as silver specks, clusters, or nuclei) are generated by irradiation or light exposure of the photographic silver halide, those nuclei are able to catalyze the reduction of the reducible silver source. It has long been understood that silver atoms ($Ag°$) are a catalyst for the reduction of silver ions, and that the photosensitive silver halide can be placed into catalytic proximity with the non-photosensitive, reducible silver source in a number of different fashions. The silver halide may be made "in situ," for example by adding a halogen-containing source to the reducible silver source to achieve partial metathesis (see, for example, U.S. Pat. No. 3,457,075); or by coprecipitation of silver halide and the reducible silver source material (see, for example, U.S. Pat. No. 3,839,049). The silver halide may also be made "ex situ" and added to the organic silver salt. The addition of silver halide grains to photothermographic materials is described in *Research Disclosure*, June 1978, Item No. 17029. It is also reported in the art that when silver halide is made ex situ, one has the possibility of controlling the composition and size of the grains much more precisely, so that one can impart more specific properties to the photothermographic element and can do so much more consistently than with the in situ technique.

The non-photosensitive, reducible silver source is a material that contains silver ions. Typically, the preferred non-photosensitive reducible silver source is a silver salt of a long chain aliphatic carboxylic acid having from 10 to 30 carbon atoms. The silver salt of behenic acid or mixtures of acids of similar molecular weight are generally used. Salts of other organic acids or other organic materials, such as silver imidazolates, have been proposed. U.S. Pat. No. 4,260,677 discloses the use of complexes of inorganic or organic silver salts as non-photosensitive, reducible silver sources.

In both photographic and photothermographic emulsions, exposure of the photographic silver halide to light produces small clusters of silver atoms ($Ag°$). The imagewise distribution of these clusters is known in the art as a latent image. This latent image is generally not visible by ordinary means. Thus, the photosensitive emulsion must be further processed to produce a visible image. This is accomplished by the reduction of silver ions which are in catalytic proximity to silver halide grains bearing the clusters of silver atoms, (i.e., the latent image).

In photothermographic and thermographic elements, the reducing agent for the organic silver salt, often referred to as a "developer," may be any material, preferably any organic material, that can reduce silver ion to metallic silver. At elevated temperatures, in the presence of the latent image, the non-photosensitive reducible silver source (e.g., silver behenate) is reduced by the reducing agent for silver ion. This produces a negative black-and-white image of elemental silver.

While conventional photographic developers such as methyl gallate, hydroquinone, substituted-hydroquinones, catechol, pyrogallol, ascorbic acid, and ascorbic acid derivatives are useful, they tend to result in very reactive photothermographic formulations and fog during preparation and coating of photothermographic elements. As a result, hindered phenol reducing agents have traditionally been preferred.

As the visible image in black-and-white photothermographic and thermographic elements is usually produced entirely by elemental silver ($Ag°$), one cannot readily decrease the amount of silver in the emulsion without reducing the maximum image density. However, reduction of the amount of silver is often desirable to reduce the cost of raw materials used in the emulsion and/or to enhance performance. For example, toning agents may be incorporated to improve the color of the silver image of the photothermographic element. Another method of increasing the maximum image density in photographic and photothermographic emulsions without increasing the amount of silver in the emulsion layer is by incorporating dye-forming or dye-releasing materials in the emulsion. Upon imaging, the dye-forming or dye-releasing material is oxidized, and a dye and a reduced silver image are simultaneously formed in the exposed region. In this way, a dye-enhanced black-and-white silver image can be produced.

Thermographic imaging constructions (i.e., heat-developable materials) processed with heat, and without liquid development, are widely known in the imaging arts and rely on the use of heat to help produce an image. These elements generally comprise a support or substrate (such as paper, plastics, metals, glass, and the like) having coated thereon:

(a) a thermally-sensitive, reducible silver source; (b) a reducing agent for the thermally-sensitive, reducible silver source (i.e., a developer); and (c) a binder.

In a typical thermographic construction, the image-forming layers are based on silver salts of long chain fatty acids. Typically, the preferred non-photosensitive reducible silver source is a silver salt of a long chain aliphatic carboxylic acid having from 10 to 30 carbon atoms. The silver salt of behenic acid or mixtures of acids of similar molecular weight are generally used. At elevated temperatures, silver behenate is reduced by a reducing agent for silver ion such as methyl gallate, hydroquinone, substituted-hydroquinones, hindered phenols, catechol, pyrogallol, ascorbic acid, ascorbic acid derivatives, and the like, whereby an image comprised of elemental silver is formed.

Many times, the thermographic construction is brought into contact with the thermal head of a thermographic recording apparatus, such as a thermal printer, thermal facsimile, and the like. In such instances, an anti-stick layer is coated on top of the imaging layer to prevent sticking of the thermographic construction to the thermal head of the apparatus utilized. The resulting thermographic construction is then heated to an elevated temperature, typically in the range of about 60°–225° C., resulting in the formation of an image.

The imaging arts have long recognized that the fields of photothermography and thermography are clearly distinct from that of photography. Photothermographic and thermographic elements differ significantly from conventional silver halide photographic elements which require wet-processing.

In photothermographic and thermographic imaging elements, a visible image is created by heat as a result of the reaction of a developer incorporated within the element. Heat is essential for development and temperatures of over 100° C. are routinely required. In contrast, conventional wet-processed photographic imaging elements require processing in aqueous processing baths to provide a visible image (e.g., developing and fixing baths) and development is usually performed at a more moderate temperature (e.g., 30°–50° C.).

In photothermographic elements only a small amount of silver halide is used to capture light and a different form of silver (e.g., silver behenate) is used to generate the image with heat. Thus, the silver halide serves as a catalyst for the development of the non-photosensitive, reducible silver source. In contrast, conventional wet-processed black-and-white photographic elements use only one form of silver (e.g., silver halide) which, upon development, is itself converted to the silver image. Additionally, photothermographic elements require an amount of silver halide per unit area that is as little as one-hundredth of that used in conventional wet-processed silver halide.

Photothermographic systems employ a light-insensitive silver salt, such as silver behenate, which participates with the developer in developing the latent image. In contrast, photographic systems do not employ a light-insensitive silver salt directly in the image-forming process. As a result, the image in photothermographic elements is produced primarily by reduction of the light-insensitive silver source (silver behenate) while the image in photographic black-and-white elements is produced primarily by the silver halide.

In photothermographic and thermographic elements, all of the "chemistry" of the system is incorporated within the element itself. For example, photothermographic and thermographic elements incorporate a developer (i.e., a reducing agent for the non-photosensitive reducible source of silver) within the element while conventional photographic elements do not. The incorporation of the developer into photothermographic elements can lead to increased formation of "fog" upon coating of photothermographic emulsions as compared to photographic emulsions. Even in so-called instant photography, developer chemistry is physically separated from the silver halide until development is desired. Much effort has gone into the preparation and manufacture of photothermographic and thermographic elements to minimize formation of fog upon coating, storage, and post-processing aging.

Similarly, in photothermographic elements, the unexposed silver halide inherently remains after development and the element must be stabilized against further development. In contrast, the silver halide is removed from photographic elements after development to prevent further imaging (i.e., the fixing step).

In photothermographic and thermographic elements the binder is capable of wide variation and a number of binders are useful in preparing these elements. In contrast, photographic elements are limited almost exclusively to hydrophilic colloidal binders such as gelatin.

Because photothermographic and thermographic elements require thermal processing, they pose different considerations and present distinctly different problems in manufacture and use. In addition, the effects of additives (e.g., stabilizers, antifoggants, speed enhancers, sensitizers, supersensitizers, etc.) which are intended to have a direct effect upon the imaging process can vary depending upon whether they have been incorporated in a photothermographic or thermographic element or incorporated in a photographic element.

Distinctions between photothermographic and photographic elements are described in *Imaging Processes and Materials (Neblette's Eighth Edition)*; J. Sturge et al. Ed; Van Nostrand Reinhold: New York, 1989; Chapter 9 and in *Unconventional Imaging Processes*; E. Brinckman et al, Ed; The Focal Press: London and New York: 1978; pp. 74–75.

Hydrazides have been used in conventional wet processed black-and-white and color photographic systems. They have found use as nucleating agents, infectious developers, contrast, and speed improving agents, and color developing agents.

Hydrazides have been studied as infectious developers for use in photographic graphic arts films. See U.S. Pat. Nos. 4,798,790 and 4,925,832 and Kitchin, J. P. et at. *J. Photogr. Sci.* 1987, 35, 162–164 and Kitchin, J. P. et al. *J. Imag. Technol.* 1989, 15(6), 282–284.

The use of hydrazides with hydroquinone type (e.g., polyhydroxy benzene) developers is known to produce photographic elements with very high contrast in wet silver halide photographic materials. These materials have been found to be very advantageous for graphic arts laser imaging applications.

U.S. Pat. Nos. 4,772,531; 4,891,295; 4,902,599; 4,952,474; 4,970,132; 5,037,719; 5,070,132; 5,196,288; and 5,246,811 all refer to the use of formylphenyl hydrazines and/or their derivatives, in combination with traditional wet-silver halide-type developers, silver halide, a polymerizable compound, and a dye or color-forming compound are sometimes contained in microcapsules which are dispersed in a light-sensitive layer. Upon imaging and heat development of the light sensitive material, the hydrazide initiates polymerization within the area where the latent image has been formed. Pressure is then applied to transfer the dye image from the unpolymerized capsules to a receiving sheet. Silver soaps are optionally included and incorporation of the polymerization and dye-forming materials into microcapsules is preferred.

U.S. Pat. No. 4,735,884 uses trityl hydrazides in a gelatin-based construction as a reducing agent for silver halide as well as an initiator for the polymerization of acrylates within the area where the latent image has been formed. The hydrazides are encapsulated with other traditional silver halide developers, the photosensitive silver halide and leuco dyes or pre-formed dyes. After exposure, heat is applied to accelerate the crosslinking reactions, pressure is applied to break the non-exposed capsules, and the positive color image is transferred to a receiving layer.

U.S. Pat. No. 4,772,531 combines a sulfonamidophenol developing agent moiety and a trityl hydrazide group in one molecule to minimize the need for an additional developer within the polymerization system.

In black-and-white microencapsulation applications, U.S. Pat. No. 3,667,958 uses hydrazines and aryl hydrazides with hydroquinone-type developers as reducing agents in photothermographic compositions to produce black-and-white images. The hydrazide of choice is 1-formyl-2-phenyl hydrazine.

U.S. Pat. No. 3,782,949 specifically uses hydroxy-substituted aliphatic carboxylic acid aryl hydrazides with diaminophenol and 3-pyrazolidenone auxiliary developers to produce photothermographic images.

It would be most desirable to be able to achieve the high contrast in dry photothermographic or thermographic elements that is currently available in wet-silver halide materials. Previous efforts to accomplish this have been unsuccessful and the ability to accomplish this would be a major advance in the art of dry photo-thermographic or thermographic imaging. New developing agent systems for photothermographic systems are desired to provide improved sensitometric properties such as high contrast for very high quality imaging.

SUMMARY OF THE INVENTION

In accordance with the present invention, it has now been discovered that a reducing agent system (i.e., a developer system) consisting essentially of at least one hindered phenol developer and at least one trityl hydrazide co-developer and/or at least one formyl-phenyl hydrazine co-developer or a mixture of at least one trityl hydrazide co-developer and at least one formyl-phenyl hydrazine co-developer provides a black-and-white photothermographic and thermographic element having very high contrast and high image density (Dmax).

The present invention provides heat-developable, photothermographic and thermographic elements which are capable of providing high photospeeds; stable, high density images with high resolution; good sharpness; high contrast; and good shelf stability. The possibility of low absorbance at 350–450 nm facilitates the use of the elements of this invention in graphic arts applications such as contact printing, proofing, and duping.

The heat-developable, photothermographic elements comprise:

(a) a photosensitive silver halide;

(b) a non-photosensitive, reducible silver source;

(c) a reducing agent system for the non-photosensitive, reducible silver source;

(d) a binder; and (e) a support;

wherein the reducing system contains at least one hindered phenol developer and at least one co-developer of the formula:

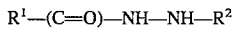

wherein:

$R^1$ represents hydrogen and $R^2$ represents an aryl or substituted aryl group; or, $R^1$ represents hydrogen, alkyl or alkenyl groups of up to 20 carbon atoms, preferably alkyl or alkenyl groups of up to 10 carbon atoms, and more preferably of up to 5 carbon atoms; alkoxy, thioalkoxy, or amido groups of up to 20 carbon atoms, preferably of up to 10 carbon atoms, and more preferably of up to 5 carbon atoms; aryl, alkaryl, or aralkyl groups comprising up to 20 carbon atoms, preferably of up to 10 carbon atoms, and more preferably up to 6 carbon atoms; aryloxy, thioaryloxy, or anilino groups of up to 20 carbon atoms, preferably of up to 10 carbon atoms, and more preferably of up to 6 carbon atoms; aliphatic or aromatic heterocyclic ring groups containing up to 6 ring atoms; carbocyclic ring groups comprising up to 6 ring carbon atoms; or fused ring or bridging groups comprising up to 14 ring atoms; and $R^2$ represents a trityl group.

When $R^2$ represents a trityl group, the compounds are referred to herein as trityl hydrazides. The phrase "trityl group" is often used to refer to the triphenylmethyl group ($Ph_3C-$). AS used herein, the phrase "trityl group" is broadened to include triarylmethyl (i.e., $C-Ar_3$), triphenylmethyl and substituted-triphenylmethyl, as well as triphenylmethyl type groups wherein two of the phenyl groups are joined (as in compound H-27 below).

When $R^1$ represents H and $R^2$ represents aryl or substituted aryl, the compounds are referred to herein as "formyl phenyl hydrazines" or "formyl-aryl hydrazines."

As used herein, "aryl" preferably represents phenyl or naphthyl.

When the photothermographic element used in this invention is heat developed, preferably at a temperature of from about 80° C. to about 250° C. (176° F. to 482° F.) for a duration of from about 1 second to about 2 minutes, in a substantially water-free condition after, or simultaneously with, imagewise exposure, a black-and-white silver image is obtained.

In photothermographic elements of the present invention, the layer(s) that contain the photographic silver salt are referred to herein as emulsion layer(s). According to the present invention, one or more components of the reducing agent system is added either to the emulsion layer(s) or to a layer or layers adjacent to the emulsion layer(s). Layers that are adjacent to the emulsion layer(s) may be, for example, protective topcoat layers, primer layers, interlayers, opacifying layers, antihalation layers, barrier layers, auxiliary layers, etc. It is preferred that the reducing agent system be present in the photothermographic emulsion layer or topcoat layer.

The present invention also provides a process for the formation of a visible image by first exposing to electromagnetic radiation and thereafter heating the inventive photothermographic element described earlier herein.

The present invention also provides a process comprising the steps of:

(a) exposing the inventive photothermographic element described earlier herein to electromagnetic radiation, to which the silver halide grains of the element are sensitive, to generate a latent image;

(b) heating the exposed element to develop the latent image into a visible image;

(c) positioning the element with a visible image thereon between a source of ultraviolet or short wavelength visible radiation energy and an ultraviolet or short wavelength radiation photosensitive imageable medium; and (d) thereafter exposing the imageable medium to ultraviolet or short wavelength visible radiation through the visible image on the element, thereby absorbing ultraviolet or short wavelength visible radiation in the areas of the element where there is a visible image and transmitting ultraviolet or short wavelength visible radiation through areas of the element where there is no visible image.

The photothermographic element may be exposed in step (a) with visible, infrared, or laser radiation.

The heat-developable, thermographic elements of the present invention comprise:

(a) a non-photosensitive, reducible silver source;

(b) a reducing agent system for the non-photosensitive, reducible silver source;

(c) a binder; and (d) a support; wherein the reducing system contains at least one hindered phenol developer and at least one co-developer of the formula:

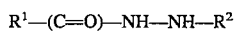

$$R^1-(C=O)-NH-NH-R^2$$

wherein:

$R^1$ represents hydrogen and $R^2$ represents an aryl or substituted aryl group; or $R^1$ represents hydrogen, alkyl or alkenyl groups of up to 20 carbon atoms, preferably alkyl or alkenyl groups of up to 10 carbon atoms, and more preferably of up to 5 carbon atoms; alkoxy, thioalkoxy, or amido groups of up to 20 carbon atoms, preferably of up to 10 carbon atoms, and more preferably of up to 5 carbon atoms; aryl, alkaryl, or aralkyl groups comprising up to 20 carbon atoms, preferably of up to 10 carbon atoms, and more preferably up to 6 carbon atoms; aryloxy, thioaryloxy, or anilino groups of up to 20 carbon atoms, preferably of up to 10 carbon atoms, and more preferably of up to 6 carbon atoms; aliphatic or aromatic heterocyclic ring groups containing up to 6 ring atoms; carbocyclic ring groups comprising up to 6 ring carbon atoms; or fused ring or bridging groups comprising up to 14 ring atoms; and $R^2$ represents a trityl group.

In thermographic elements of the present invention, the layer(s) that contain the non-photosensitive reducible silver source are referred to herein as thermographic layer(s) or thermographic emulsion layer(s). When used in thermographic elements according to the present invention, one or more components of the reducing agent system is added either to the thermographic emulsion layer(s) or to a layer or layers adjacent to the emulsion layer(s). Layers that are adjacent to the emulsion layer(s) may be, for example, protective topcoat layers, primer layers, interlayers, opacifying layers, barrier layers, auxiliary layers, etc. It is preferred that the reducing agent system be present in the thermographic layer or topcoat layer.

When the thermographic element used in this invention is heat developed, preferably at a temperature of from about 80° C. to about 250° C. (176° F. to 482° F.) for a duration of from about 1 second to about 2 minutes in a substantially water-free condition, a black-and-white silver image is obtained. The present invention also provides a process for the formation of a visible image by heating the inventive thermographic element described earlier herein. The present invention further provides a process comprising the steps of:

(a) heating the inventive thermographic element described earlier herein at a temperature sufficient to generate a visible image thereon;

(b) positioning the thermographic element with a visible image thereon between a source of ultraviolet or short wavelength visible radiation and an ultraviolet or short wavelength visible radiation photo-sensitive imageable medium; and (c) thereafter exposing the imageable medium to ultraviolet or short wavelength visible radiation through the visible image on the element, thereby absorbing ultraviolet or short wavelength visible radiation in the areas of the element where there is a visible image and transmitting ultraviolet or short wavelength visible radiation through areas of the element where there is no visible image.

The reducing agent system (i.e., combination of developers) used in this invention provide a significant improvement in image contrast when compared to photothermographic and thermographic elements incorporating known developers or developer combinations.

The addition of at least one trityl hydrazide and/or at least one formylphenyl hydrazine to black-and-white photothermographic emulsions containing at least one hindered phenol developer provides high Dmax, fast speeds, and high contrast. The shape of the sensitometric D log E curve is similar to that observed for infectious development curves in hard dot black-and-white conventionally processed wet silver halide image-setting elements.

The addition of at least one trityl hydrazide compound and/or one formylphenyl hydrazine compound as co-developers (also known as co-reducing agents or auxiliary developers) allows the preparation of hard dot dry silver masks of high image quality useful for the production of plates in image-setting applications, as well as contact proofs and dupe films also useful in the graphic arts. These masks are presently produced from conventional wet silver halide materials.

Heating in a substantially water-free condition as used herein, means heating at a temperature of 80° to 250° C. The term "substantially water-free condition" means that the reaction system is approximately in equilibrium with water in the air, and water for inducing or promoting the reaction is not particularly or positively supplied from the exterior to the element. Such a condition is described in T. H. James, *The Theory of the Photographic Process*, Fourth Edition, Macmillan 1977, page 374.

As used herein the term "photothermographic element" means a construction comprising at least one photothermographic emulsion layer and any supports, topcoat layers, image receiving layers, blocking layers, antihalation layers, subbing or priming layers, etc.

As used herein the term "thermographic element" means a construction comprising at least one thermographic emulsion layer and any support, topcoat layers, antihalation layers, blocking layers, etc.

As used herein, the term "emulsion layer" means a layer of a photothermographic or thermographic element that contains the light-insensitive silver source material and the photosensitive silver salt (when used).

For purposes of this invention the ultraviolet region of the spectrum is defined as that region of the spectrum below 400 nm, preferably from 100 nm to 400 nm. More preferably, the ultraviolet region of the spectrum is the region between 190 nm and 400 nm.

For purposes of this invention the short wavelength visible region of the spectrum is defined as that region of the spectrum from about 400 nm to about 450 nm.

For the purposes of this invention the infrared region of the spectrum is defined as 750–1400 nm, the visible region of the spectrum is defined as 400–750 nm, and the red region of the spectrum is defined as 640–750 nm. Preferably the red region of the spectrum is 650–700 nm.

$R^1$ and/or $R^2$ may contain additional substituent groups. As is well understood in this area, substitution is not only tolerated, but is often advisable and substitution is anticipated on the compounds used in the present invention. As a means of simplifying the discussion and recitation of certain substituent groups, the terms "group" and "moiety" are used to differentiate between those chemical species that may be substituted and those which may not be so substituted. Thus, when the term "group," or "aryl group," is used to describe a substituent, that substituent includes the use of additional substituents beyond the literal definition of the basic group. Where the term "moiety" is used to describe a substituent, only the unsubstituted group is intended to be included. For example, the phrase, "alkyl group" is intended to include not only pure hydrocarbon alkyl chains, such as methyl, ethyl, propyl, t-butyl, cyclohexyl, iso-octyl, octadecyl and the like, but also alkyl chains bearing substituents known in the art, such as hydroxyl, alkoxy, phenyl, halogen atoms (F, Cl, Br, and I), cyano, nitro, amino, carboxy, etc. For example, alkyl group includes ether groups (e.g., $CH_3$—$CH_2$—$CH_2$—O—$CH_2$—), haloalkyls, nitroalkyls, carboxyalkyls, hydroxyalkyls, sulfoalkyls, etc. On the other hand, the phrase "alkyl moiety" is limited to the inclusion of only pure hydrocarbon alkyl chains, such as methyl, ethyl, propyl, t-butyl, cyclohexyl, iso-octyl, octadecyl, and the like. Substituents that react with active ingredients, such as very strongly electrophilic or oxidizing substituents, would of course be excluded by the ordinarily skilled artisan as not being inert or harmless.

Other aspects, advantages, and benefits of the present invention are apparent from the detailed description, examples, and claims.

DETAILED DESCRIPTION OF THE INVENTION

In photothermographic elements there exists the desire for products which exhibit increased contrast upon exposure to light and subsequent development. This desire is based upon the realization that contrast is directly related to the appearance of sharpness. Thus, products which exhibit increased contrast give the visual impression of enhanced sharpness.

Traditionally contrast has been defined by two methods, both of which are derived from the D-Log E curve. The first method is the determination of gamma, γ, which is defined as the slope of the straight-line section of the D-log E curve. The second is the determination of the overall sharpness of the toe section of the D-log E curve. By sharpness of the toe section, it is usually meant the relative change in density with exposure. For instance, a sharp toe corresponds to a very rapid rise in density with exposure, whereas a soft toe corresponds to a very gradual rise in density with exposure. If either the value of γ is high or the toe is sharp, then the image has a relatively high contrast. If the value of y is low, or the toe is soft, the image has a relatively low contrast.

Photothermographic and thermographic systems have not found widespread use as replacement for wet silver halide in imaging systems because of slow speed, low Dmax, poor contrast, and insufficient sharpness at high Dmax. U.S. patent applications Ser. Nos. 08/072,153 (filed Nov. 23, 1993) and 08/239,984 (filed May 9, 1994) describe most of the characteristics and attributes of a photo-thermographic element having, for example, an antihalation system, silver halide grains having an average particle size of less than 0.10 μm, and infrared supersensitization leading to an infrared photothermographic article meeting the requirements for medical or graphic arts laser recording applications.

The photothermographic elements of this invention may be used to prepare black-and-white images. The photothermographic material of this invention can be used, for example, in conventional black-and-white photothermography, in electronically generated black-and-white hardcopy recording, in the graphic arts area, and in digital proofing. The material of this invention provides high photo-speeds, provides strongly absorbing black-and-white images, and provides a dry and rapid process.

In the reducing system, the hindered phenol developer should be present at from 1 to 15% by weight of the imaging layer. When used, the trityl hydrazide co-developer should be present at from 0.1 to 15% by weight of the imaging layer. When used; the formyl-phenyl hydrazine co-developer should be present at from 0.005 to 0.15% by weight of the imaging layer.

In multilayer constructions, if one of the developers of the reducing system is added to a layer other than the emulsion layer, slightly higher proportions may be necessary and the hindered phenol should be present at from 2 to 20% by weight; the trityl hydrazide co-developer when used should be present at from 0.2 to 20% by weight; and the formyl-phenyl hydrazide when used should be present at from 0.01 to 0.20% by weight of the layer in which it is present.

The amounts of the above described reducing agents of the reducing agent system that are added to the photothermographic or thermographic element of the present invention may be varied depending upon the particular compound used, upon the type of emulsion layer, and whether components of the reducing system are located in the emulsion layer or a topcoat layer. However, when present in the emulsion layer, the hindered phenol should be present in an amount of from 0.01 to 50 mole, preferably from 0.05 to 25 mole; the trityl hydrazide should be present in an amount of from 0.0005 to 25 mole, preferably from 0.0025 to 10 mole; and the formyl-phenyl hydrazide should be present in an amount of 0.0001 to 0.1 mole, preferably from 0.0005 to 0.05 mole—per mole of the silver halide.

Photothermographic elements of the invention may also contain other additives such as shelf-life stabilizers, toners, development accelerators, acutance dyes, post-processing stabilizers or stabilizer precursors, and other image-modifying agents.

The Reducing Agent System for the Non-Photosensitive Reducible Silver Source

When used in black-and-white photothermographic and thermographic elements, the reducing agent system (i.e., the developer system) for the organic silver salt consists essentially of at least one hindered phenol compound and at least one co-developer of the formula:

$$R^1—(C=O)—NH—NH—R^2$$

Hindered phenol developers are compounds that contain only one hydroxy group on a given phenyl ting and have at least one additional substituent located ortho to the hydroxy group. They differ from traditional photographic developers which contain two hydroxy groups on the same phenyl ting (such as is found in hydroquinones). Hindered phenol developers may contain more than one hydroxy group as long as they are located on different phenyl tings. Hindered phenol developers include, for example, binaphthols (i.e., dihydroxybinaphthyls), biphenols (i.e., dihydroxybiphenyls), bis(hydroxynaphthyl)methanes, bis(hydroxyphenyl)methanes, hindered phenols, and naphthols.

Non-limiting representative binaphthols include 1,1'-bi-2-naphthol; 1,1'-bi-4-methyl-2-naphthol; and 6,6'-dibromo-bi-2-naphthol. For additional compounds see U.S. Pat. No. 5,262,295 at column 6, lines 12–13, incorporated herein by reference.

Non-limiting representative biphenols include 2,2'-dihydroxy-3,3 '-di-t-butyl-5,5-dimethylbiphenyl; 2,2'-dihydroxy-3,3',5,5'-tetra-t-butylbiphenyl; 2,2'-dihydroxy-3,3'-di-t-butyl-5,5'-dichlorobiphenyl; 2-(2-hydroxy-3-t-butyl-5-methylphenyl)-4-methyl-6-n-hexylphenol; 4,4'-dihydroxy-3,3',5,5'-tetra-t-butylbiphenyl; and 4,4'-dihydroxy-3,3',5,5'-tetramethylbiphenyl. For additional compounds see U.S. Pat. No. 5,262,295 at column 4, lines 17–47, incorporated herein by reference.

Non-limiting representative bis(hydroxynaphthyl)methanes include 2,2'-methylene-bis(2-methyl-1-naphthol)methane. For additional compounds see U.S. Pat. No. 5,262,295 at column 6, lines 14–16, incorporated herein by reference.

Non-limiting representative bis(hydroxyphenyl)methanes include bis(2-hydroxy-3-t-butyl-5-methylphenyl)methane (CAO-5); 1,1-bis(2-hydroxy-3,5-dimethylphenyl)-3,5,5-trimethylhexane (Permanax™); 1,1'-bis(3,5-tetra-t-butyl-4-hydroxy)methane; 2,2-bis(4-hydroxy-3-methylphenyl)propane; 4,4-ethylidene-bis(2-t-butyl-6-methylphenol); and 2,2-bis(3,5-dimethyl-4-hydroxyphenyl)propane. For additional compounds see U.S. Pat. No. 5,262,295 at column 5 line 63 to column 6, line 8 incorporated herein by reference.

Non-limiting representative hindered phenols include 2,6-di-t-butylphenol; 2, 6-di-t-butyl-4-methylphenol; 2,4-di-t-butylphenol; 2,6-dichlorophenol; 2,6-dimethylphenol; and 2-t-butyl-6-methylphenol.

Non-limiting representative hindered naphthols include 1-naphthol; 4-methyl- 1-naphthol; 4-methoxy- 1-naphthol; 4-chloro- 1-naphthol; and 2-methyl-1-naphthol. For additional compounds see U.S. Pat. No. 5,262,295 at column 6, lines 17–20, incorporated herein by reference.

The co-developer may be a trityl hydrazide, a mixture of trityl hydrazides, a formyl-phenyl hydrazine, a mixture of formyl-phenyl hydrazines, or a mixture of at least one trityl hydrazide and at least one formyl-phenyl hydrazine.

Trityl hydrazides may be prepared by the reaction at room temperature of a stirred solution of a hydrazide and a slight molar excess of triethylamine dissolved in acetonitrile with an appropriately substituted trityl chloride (chlorotriphenylmethane). The trityl chloride is added gradually over a period of about 5 minutes. The mixture is warmed to 40° C. for approximately 1 hour. The mixture is poured into water and the resulting precipitate is filtered. In most cases, recrystallization of the solid from ethyl alcohol is appropriate.

Formyl-phenyl hydrazines may be prepared by the addition of an appropriately substituted phenyl hydrazine at 0° C. to a solution of formamide in acetic acid. After stirring for several hours at room temperature the mixture is poured into water and the resulting precipitate is filtered. In most cases, recrystallization of the solid from ethyl alcohol is appropriate.

Representative trityl hydrazide and formyl-phenyl hydrazine co-developer compounds useful in the present invention are shown below. Preparation for these compounds are described later herein. These representations are exemplary and are not intended to be limiting.

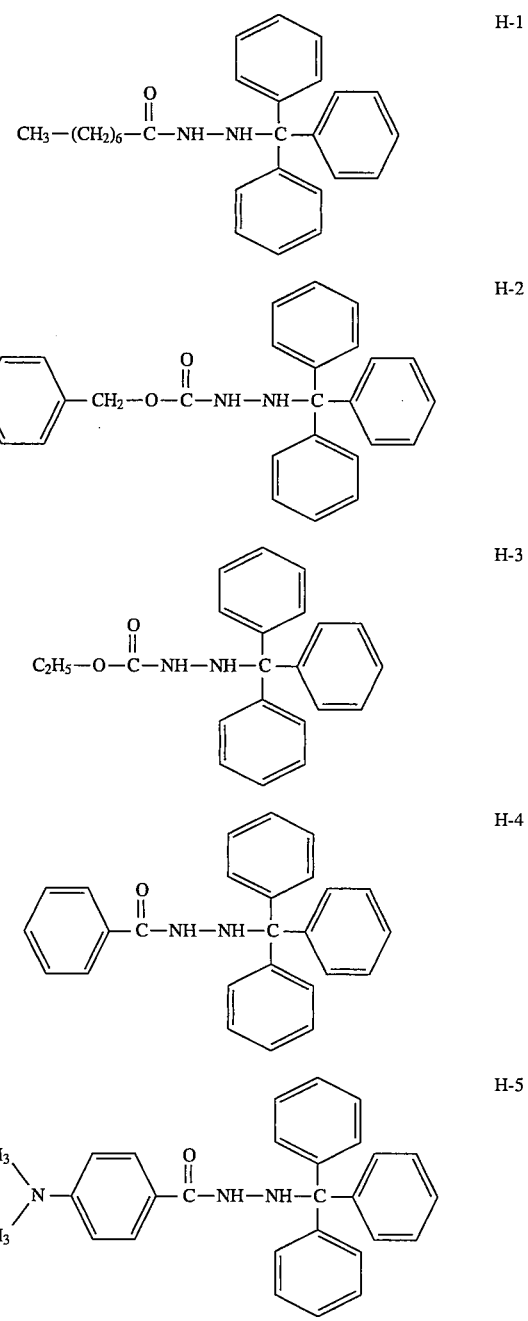

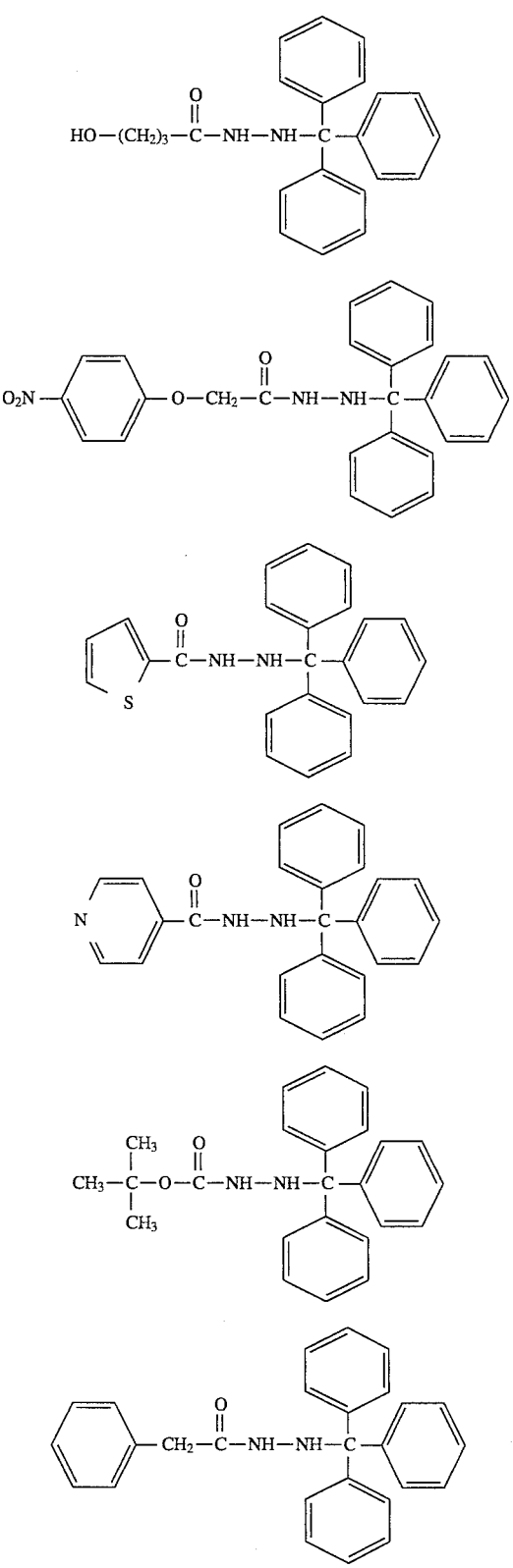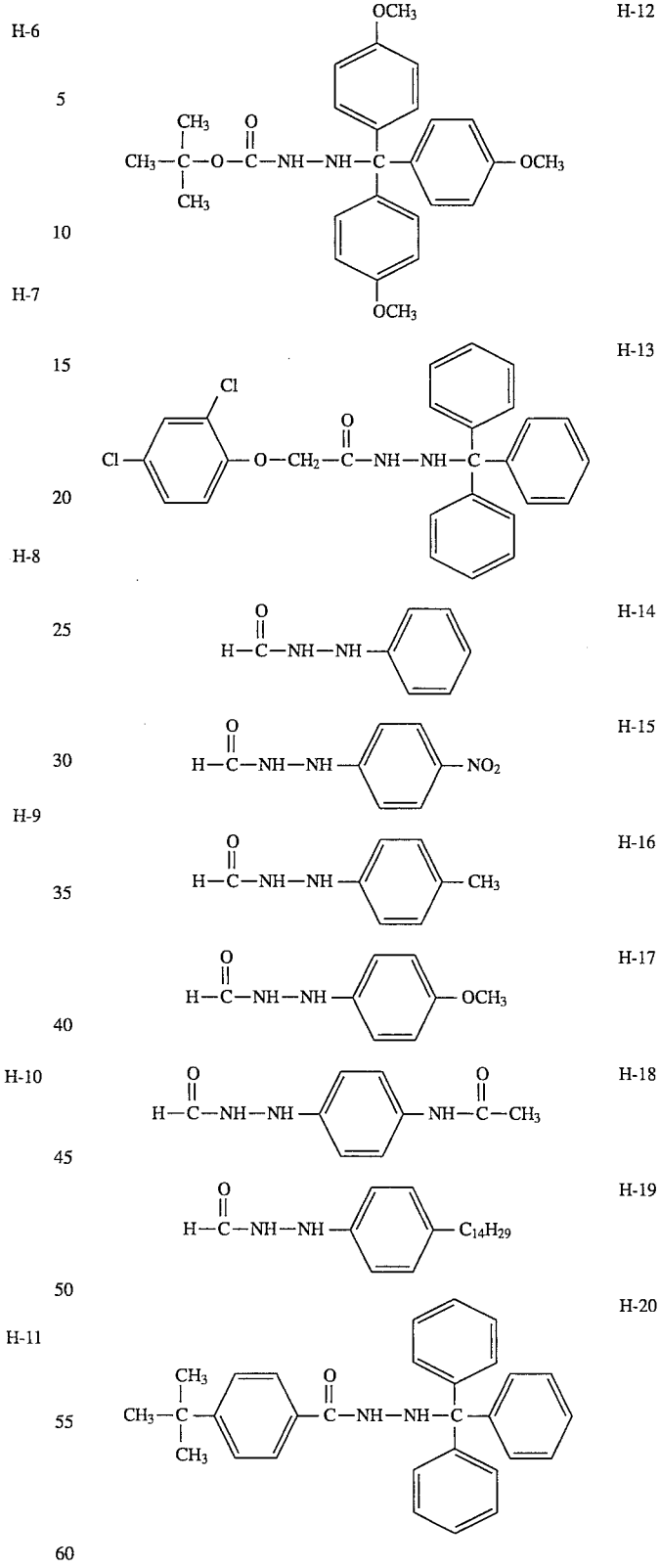

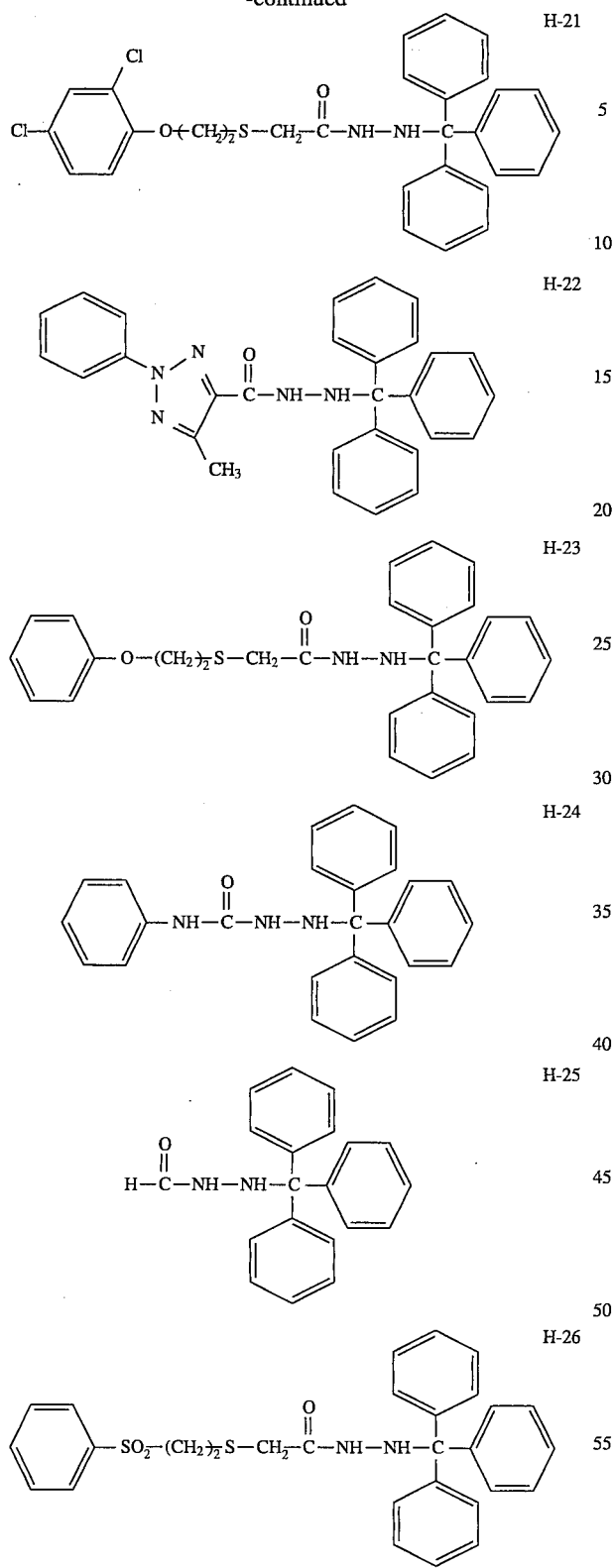
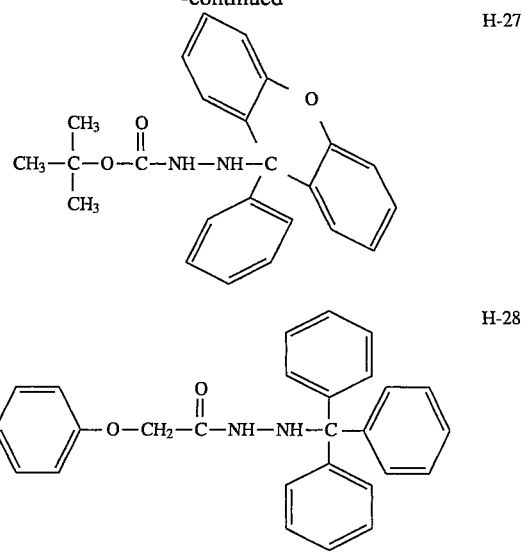

The Photosensitive Silver Halide

As noted above, when used in a photothermographic element, the present invention includes a photosensitive silver halide. The photosensitive silver halide can be any photosensitive silver halide, such as silver bromide, silver iodide, silver chloride, silver bromoiodide, silver chlorobromoiodide, silver chlorobromide, etc. The photosensitive silver halide can be added to the emulsion layer in any fashion so long as it is placed in catalytic proximity to the organic silver compound which serves as a source of reducible silver.

The silver halide may be in any form which is photosensitive including, but not limited to cubic, octahedral, rhombic dodecahedral, orthorhombic, tetrahedral, other polyhedral habits, etc., and may have epitaxial growth of crystals thereon.

The silver halide grains may have a uniform ratio of halide throughout; they may have a graded halide content, with a continuously varying ratio of, for example, silver bromide and silver iodide; or they may be of the core-shell-type, having a discrete core of one halide ratio, and a discrete shell of another halide ratio. Core-shell silver halide grains useful in photothermographic elements and methods of preparing these materials are described in U.S. patent application Ser. No. 08/199,114 (filed Feb. 22, 1994). A core-shell silver halide grain having an iridium doped core is particularly preferred. Iridium doped core-shell grains of this type are described in U.S. patent application Ser. No. 08/239,984 (filed May 9, 1994).

The silver halide may be prepared ex situ, (i.e., be pre-formed) and mixed with the organic silver salt in a binder prior to use to prepare a coating solution. The silver halide may be pre-formed by any means, e.g., in accordance with U.S. Pat. No. 3,839,049. For example, it is effective to blend the silver halide and organic silver salt using a homogenizer for a long period of time. Materials of this type are often referred to as "pre-formed emulsions." Methods of preparing these silver halide and organic silver salts and manners of blending them are described in *Research Disclosure*, June 1978, item 17029; U.S. Pat. Nos. 3,700,458 and 4,076,539; and Japanese Patent Application Nos. 13224/74, 42529/76, and 17216/75.

It is desirable in the practice of this invention to use pre-formed silver halide grains of less than 0.10 μm in an infrared sensitized, photothermographic material. Preferably the number average particle size of the grains is between 0.01 and 0.08 μm; more preferably, between 0.03 and 0.07 μm; and most preferably, between 0.04 and 0.06 μm. It is also preferred to use iridium doped silver halide grains and iridium doped core-shell silver halide grains as disclosed in U.S. patent application Ser. Nos. 08/072,153, and 08/239,984 described above.

Pre-formed silver halide emulsions when used in the material of this invention can be unwashed or washed to remove soluble salts. In the latter case, the soluble salts can be removed by chill-setting and leaching or the emulsion can be coagulation washed, e.g., by the procedures described in U.S. Pat. Nos. 2,618,556; 2,614,928; 2,565,418; 3,241,969; and 2,489,341.

It is also effective to use an in situ process, i.e., a process in which a halogen-containing compound is added to an organic silver salt to partially convert the silver of the organic silver salt to silver halide.

The light sensitive silver halide used in the present invention can be employed in a range of about 0.005 mole to about 0.5 mole; preferably, from about 0.01 mole to about 0.15 mole per mole; and more preferably, from 0.03 mole to 0.12 mole per mole of non-photosensitive reducible silver salt.

The silver halide used in the present invention may be chemically and spectrally sensitized in a manner similar to that used to sensitize conventional wet-processed silver halide or state-of-the-art heat-developable photographic materials.

For example, it may be chemically sensitized with a chemical sensitizing agent, such as a compound containing sulfur, selenium, tellurium, etc., or a compound containing gold, platinum, palladium, ruthenium, rhodium, iridium, etc., a reducing agent such as a tin halide, etc., or a combination thereof. The details of these procedures are described in T. H. James, *The Theory of the Photographic Process*, Fourth Edition, Chapter 5, pp. 149 to 169. Suitable chemical sensitization procedures are also disclosed in Shepard, U.S. Pat. No. 1,623,499; Waller, U.S. Pat. No. 2,399,083; McVeigh, U.S. Pat. No. 3,297,447; and Dunn, U.S. Pat. No. 3,297,446.

Addition of sensitizing dyes to the photosensitive silver halides serves to provide them with high sensitivity to visible and infrared light by spectral sensitization. Thus, the photosensitive silver halides may be spectrally sensitized with various known dyes that spectrally sensitize silver halide. Non-limiting examples of sensitizing dyes that can be employed include cyanine dyes, merocyanine dyes, complex cyanine dyes, complex merocyanine dyes, holopolar cyanine dyes, hemicyanine dyes, styryl dyes, and hemioxanol dyes. Of these dyes, cyanine dyes, merocyanine dyes, and complex merocyanine dyes are particularly useful.

An appropriate amount of sensitizing dye added is generally about $10^{-10}$ to $10^{-1}$ mole; and preferably, about $10^{-8}$ to $10^{-3}$ moles per mole of silver halide.

Supersensitizers

To get the speed of the photothermographic elements up to maximum levels and further enhance sensitivity, it is often desirable to use supersensitizers. Any supersensitizer can be used which increases the sensitivity. For example, preferred infrared supersensitizers are described in U.S. patent application Ser. No. 07/846,919 and include heteroaromatic mercapto compounds or heteroaromatic disulfide compounds of the formula:

wherein M represents a hydrogen atom or an alkali metal atom.

In the above noted supersensitizers, Ar represents an aromatic ring or fused aromatic ring containing one or more of nitrogen, sulfur, oxygen, selenium or tellurium atoms. Preferably, the heteroaromatic ring is benzimidazole, naphthimidazole, benzothiazole, naphthothiazole, benzoxazole, naphthoxazole, benzoselenazole, benzotellurazole, imidazole, oxazole, pyrazole, triazole, thiadiazole, tetrazole, triazine, pyrimidine, pyridazine, pyrazine, pyridine, purine, quinoline or quinazolinone. However, other heteroaromatic rings are envisioned under the breadth of this invention.

The heteroaromatic ring may also carry substituents with examples of preferred substituents being selected from the group consisting of halogen (e.g., Br and Cl), hydroxy, amino, carboxy, alkyl (e.g., of 1 or more carbon atoms, preferably 1 to 4 carbon atoms) and alkoxy (e.g., of 1 or more carbon atoms, preferably of 1 to 4 carbon atoms.

Preferred supersensitizers are 2-mercaptobenzimidazole, 2-mercapto-5-methylbenzimidazole, 2-mercaptobenzothiazole, and 2-mercaptobenzoxazole.

The supersensitizers are used in general amount of at least 0.001 moles of sensitizer per mole of silver in the emulsion layer. Usually the range is between 0.001 and 1.0 moles of the compound per mole of silver and preferably between 0.01 and 0.3 moles of compound per mole of silver.

The Non-Photosensitive Reducible Silver Source Material

When used in photothermographic and thermographic elements, the present invention includes a non-photosensitive reducible silver source. The non-photo-sensitive reducible silver source that can be used in the present invention can be any material that contains a source of reducible silver ions. Preferably, it is a silver salt which is comparatively stable to light and forms a silver image when heated to 80° C. or higher in the presence of an exposed photocatalyst (such as silver halide) and a reducing agent.

Silver salts of organic acids, particularly silver salts of long chain fatty carboxylic acids, are preferred. The chains typically contain 10 to 30, preferably 15 to 28, carbon atoms. Suitable organic silver salts include silver salts of organic compounds having a carboxyl group. Examples thereof include a silver salt of an aliphatic carboxylic acid and a silver salt of an aromatic carboxylic acid. Preferred examples of the silver salts of aliphatic carboxylic acids include silver behenate, silver stearate, silver oleate, silver laureate, silver caprate, silver myristate, silver palmitate, silver maleate, silver fumarate, silver tartarate, silver furoate, silver linoleate, silver butyrate, silver camphorate, and mixtures thereof, etc. Silver salts that can be substituted with a halogen atom or a hydroxyl group also can be effectively used. Preferred examples of the silver salts of aromatic carboxylic acid and other carboxyl group-containing compounds include: silver benzoate, a silver-substituted benzoate, such as silver 3,5-dihydroxybenzoate, silver o-methylbenzoate, silver m-methylbenzoate, silver p-methylbenzoate, silver 2,4-dichlorobenzoate, silver acetamidobenzoate, silver p-phenylbenzoate, etc.; silver gallate; silver tannate; silver phthalate; silver terephthalate; silver salicylate; silver phenylacetate; silver pyromellilate; a silver salt of 3-carboxymethyl-4-methyl-4-thiazoline-2-thione or the like as described in U.S. Pat. No. 3,785,830; and a silver salt of an aliphatic carboxylic acid containing a thioether group as described in U.S. Pat. No. 3,330,663.

Silver salts of compounds containing mercapto or thione groups and derivatives thereof can also be used. Preferred examples of these compounds include: a silver salt of 3-mercapto-4-phenyl-1,2,4-triazole; a silver salt of 2-mercaptobenzimidazole; a silver salt of 2-mercapto-5-aminothiadiazole; a silver salt of 2-(2-ethylglycolamido)benzothiazole; a silver salt of thioglycolic acid, such as a silver salt of a S-alkylthioglycolic acid (wherein the alkyl group has from 12 to 22 carbon atoms); a silver salt of a dithiocarboxylic acid such as a silver salt of dithioacetic acid; a silver salt of thioamide; a silver salt of 5-carboxylic-1-methyl-2-phenyl-4-thiopyridine; a silver salt of mercaptotriazine; a silver salt of 2-mercaptobenzoxazole; a silver salt as described in U.S. Pat. No. 4,123,274, for example, a silver salt of a 1,2,4-mercaptothiazole derivative, such as a silver salt of 3-amino-5-benzylthio-1,2,4-thiazole; and a silver salt of a thione compound, such as a silver salt of 3-(2-carboxyethyl)-4-methyl-4-thiazoline-2-thione as disclosed in U.S. Pat. No. 3,201,678. Silver salts of acetylenes can also be used. Silver acetylides are described in U.S. Pat. Nos. 4,761,361 and 4,775,6 13.

Furthermore, a silver salt of a compound containing an imino group can be used. Preferred examples of these compounds include: silver salts of benzotriazole and substituted derivatives thereof, for example, silver methylbenzotriazole and silver 5-chlorobenzotriazole, etc.; silver salts of 1,2,4-triazoles or 1-H-tetrazoles as described in U.S. Pat. No. 4,220,709; and silver salts of imidazoles and imidazole derivatives.

It is also found convenient to use silver half soaps. A preferred example of a silver half soap is an equimolar blend of silver behenate and behenic acid, which analyzes for about 14.5% silver and which is prepared by precipitation from an aqueous solution of the sodium salt of commercial behenic acid.

Transparent sheet materials made on transparent film backing require a transparent coating. For this purpose a silver behenate full soap, containing not more than about 15% of free behenic acid and analyzing about 22% silver, can be used.

The method used for making silver soap dispersions is well known in the art and is disclosed in *Research Disclosure*, April 1983, item 22812, *Research Disclosure*, October 1983, item 23419, and U.S. Pat. No. 3,985,565.

The silver halide and the non-photosensitive reducible silver source material that form a starting point of development should be in catalytic proximity, i.e., reactive association. "Catalytic proximity" or "reactive association" means that they should be in the Same layer, in adjacent layers, or in layers separated from each other by an intermediate layer having a thickness of less than 1 micrometer (1 μm). It is preferred that the silver halide and the non-photosensitive reducible silver source material be present in the same layer.

Photothermographic emulsions containing pre-formed silver halide in accordance with this invention can be sensitized with chemical sensitizers, or with spectral sensitizers as described above.

The source of reducible silver material generally constitutes about 5 to about 70% by weight of the emulsion layer. It is preferably present at a level of about 10 to about 50% by weight of the emulsion layer.

The Binder

The photosensitive silver halide, the non-photosensitive reducible source of silver, the reducing agent system, and any other addenda used in the present invention are generally added to at least one binder. The binder(s) that can be used in the present invention can be employed individually or in combination with one another. It is preferred that the binder be selected from polymeric materials, such as, for example, natural and synthetic resins that are sufficiently polar to hold the other ingredients in solution or suspension.

A typical hydrophilic binder is a transparent or translucent hydrophilic colloid. Examples of hydrophilic binders include: a natural substance, for example, a protein such as gelatin, a gelatin derivative, a cellulose derivative, etc.; a polysaccharide such as starch, gum arabic, pullulan, dextrin, etc.; and a synthetic polymer, for example, a water-soluble polyvinyl compound such as polyvinyl alcohol, polyvinyl pyrrolidone, acrylamide polymer, etc. Another example of a hydrophilic binder is a dispersed vinyl compound in latex form which is used for the purpose of increasing dimensional stability of a photographic element.

Examples of typical hydrophobic binders are polyvinyl acetals, polyvinyl chloride, polyvinyl acetate, cellulose acetate, polyolefins, polyesters, polystyrene, polyacrylonitrile, polycarbonates, methacrylate copolymers, maleic anhydride ester copolymers, butadiene-styrene copolymers, and the like. Copolymers, e.g., terpolymers, are also included in the definition of polymers. The polyvinyl acetals, such as polyvinyl butyral and polyvinyl formal, and vinyl copolymers such as polyvinyl acetate and polyvinyl chloride are particularly preferred.

Although the binder can be hydrophilic or hydrophobic, preferably it is hydrophobic in the silver containing layer(s). Optionally, these polymers may be used in combination of two or more thereof.

The binders are preferably used at a level of about 30–90% by weight of the emulsion layer, and more preferably at a level of about 45–85% by weight. Where the proportions and activities of the reducing agent system for the non-photosensitive reducible source of silver require a particular developing time and temperature, the binder should be able to withstand those conditions. Generally, it is preferred that the binder not decompose or lose its structural integrity at 250° F. (121° C.) for 60 seconds, and more preferred that it not decompose or lose its structural integrity at 350° F. (177° C.) for 60 seconds.

The polymer binder is used in an amount sufficient to carry the components dispersed therein, that is, within the effective range of the action as the binder. The effective range can be appropriately determined by one skilled in the art.

Photothermographic and Thermographic Formulations

The formulation for the photothermographic and thermographic emulsion layer can be prepared by dissolving and dispersing the binder, the photosensitive silver halide (when used), the non-photosensitive reducible source of silver, the reducing agent system for the non-photosensitive reducible silver source, and optional additives, in an inert organic solvent, such as, for example, toluene, 2-butanone, or tetrahydrofuran.

The use of "toners" or derivatives thereof which improve the image, is highly desirable, but is not essential to the element. Toners can be present in an amount of about 0.01–10% by weight of the emulsion layer, preferably about 0.1–10% by weight. Toners are well known materials in the photothermographic art, as shown in U.S. Pat. Nos. 3,080,254; 3,847,612; and 4,123,282.

Examples of toners include: phthalimide and N-hydroxyphthalimide; cyclic imides, such as succinimide, pyrazoline-5-ones, quinazolinone, 1-phenylurazole, 3-phenyl-2-pyrazoline-5-one, and 2,4-thiazolidinedione;

naphthalimides, such as N-hydroxy-1,8-naphthalimide; cobalt complexes, such as cobaltic hexamine trifluoroacetate; mercaptans such as 3-mercapto-1,2,4-triazole, 2,4-dimercaptopyrimidine, 3-mercapto-4,5-diphenyl-1,2,4-triazole and 2,5-dimercapto-1,3,4-thiadiazole; N-(aminomethyl)aryldicarboximides, such as (N,N-dimethylaminomethyl)phthalimide, and N-(dimethylaminomethyl)naphthalene-2,3-dicarboximide; a combination of blocked pyrazoles, isothiuronium derivatives, and certain photo-bleach agents, such as a combination of N,N'-hexamethylene-bis(1-carbamoyl-3,5-dimethylpyrazole), 1,8-(3,6-diazaoctane)bis(isothiuronium)trifluoroacetate, and 2-(tribromomethylsulfonyl benzothiazole); merocyanine dyes such as 3-ethyl- 5-[(3-ethyl-2-benzothiazolinylidene)-1-methyl-ethylidene]-2-thio2,4-o-azolidinedione; phthalazinone, phthalazinone derivatives, or metal salts or these derivatives, such as 4-(1-naphthyl)phthalazinone, 6-chlorophthalazinone, 5,7-dimethoxyphthalazinone, and 2,3-dihydro-1,4-phthalazinedione; a combination of phthalazine plus one or more phthalic acid derivatives, such as phthalic acid, 4-methylphthalic acid, 4-nitrophthalic acid, and tetrachlorophthalic anhydride, quinazolinediones, benzoxazine or naphthoxazine derivatives; rhodium complexes functioning not only as tone modifiers but also as sources of halide ion for silver halide formation in situ, such as ammonium hexachlororhodate (III), rhodium bromide, rhodium nitrate, and potassium hexachlororhodate (III); inorganic peroxides and persulfates, such as ammonium peroxydisulfate and hydrogen peroxide; benzoxazine-2,4-diones, such as 1,3-benzoxazine-2,4-dione, 8-methyl-1,3-benzoxazine-2,4-dione, and 6-nitro- 1,3-benzoxazine-2,4-dione; pyrimidines and asym-triazines, such as 2,4-dihydroxypyrimidine, 2-hydroxy-4-aminopyrimidine, and azauracil; and tetrazapentalene derivatives, such as 3,6-dimercapto-1,4-diphenyl-1H, 4H-2,3a, 5,6a-tetraazapentalene and 1,4-di-(o-chlorophenyl)-3,6-dimercapto-1H, 4H-2,3a, 5,6a-tetraazapentalene.

The photothermographic elements used in this invention can be further protected against the additional production of fog and can be stabilized against loss of sensitivity during storage. While not necessary for the practice of the invention, it may be advantageous to add mercury (II) salts to the emulsion layer(s) as an antifoggant. Preferred mercury (II) salts for this purpose are mercuric acetate and mercuric bromide.

Other suitable antifoggants and stabilizers, which can be used alone or in combination, include the thiazolium salts described in U.S. Pat. Nos. 2,131,038 and U.S. Pat. No. 2,694,716; the azaindenes described in U.S. Pat. Nos. 2,886,437; the triazaindolizines described in U.S. Pat. No. 2,444,605; the mercury salts described in U.S. Pat. No. 2,728,663; the urazoles described in U.S. Pat. No. 3,287,135; the sulfocatechols described in U.S. Pat. No. 3,235,652; the oximes described in British Patent No. 623,448; the polyvalent metal salts described in U.S. Pat. No. 2,839,405; the thiuronium salts described in U.S. Pat. No. 3,220,839; and palladium, platinum and gold salts described in U.S. Pat. Nos. 2,566,263 and 2,597,915.

Photothermographic and thermographic elements of the invention can contain plasticizers and lubricants such as polyalcohols and diols of the type described in U.S. Pat. No. 2,960,404; fatty acids or esters, such as those described in U.S. Pat. Nos. 2,588,765 and 3,121,060; and silicone resins, such as those described in British Patent No. 955,061.

Photothermographic and thermographic elements containing emulsion layers described herein may contain matting agents such as starch, titanium dioxide, zinc oxide, silica, and polymeric beads including beads of the type described in U.S. Pat. Nos. 2,992,101 and 2,701,245.

Emulsions in accordance with this invention may be used in photothermographic and thermographic elements which contain antistatic or conducting layers, such as layers that comprise soluble salts, e.g., chlorides, nitrates, etc., evaporated metal layers, ionic polymers such as those described in U.S. Pat. Nos. 2,861,056, and 3,206,312 or insoluble inorganic salts such as those described in U.S. Pat No. 3,428,451.

Photothermographic and Thermographic Constructions

The photothermographic and thermographic elements of this invention may be constructed of one or more layers on a support. Single layer constructions should contain the silver halide (when used), the non-photosensitive, reducible silver source material, the reducing agent system for the non-photosensitive reducible silver source, the binder as well as optional materials such as toners, acutance dyes, coating aids, and other adjuvants.

Two-layer constructions should contain silver halide (when used) and non-photosensitive, reducible silver source in one emulsion layer (usually the layer adjacent to the support) and some of the other ingredients in the second layer or both layers, although two layer constructions comprising a single emulsion layer coating containing all the ingredients and a protective topcoat are envisioned.

Barrier layers, preferably comprising a polymeric material, can also be present in the photothermographic element of the present invention. Polymers for the material of the barrier layer can be selected from natural and synthetic polymers such as gelatin, polyvinyl alcohols, polyacrylic acids, sulfonated polystyrene, and the like. The polymers can optionally be blended with barrier aids such as silica.

Photothermographic and thermographic emulsions used in this invention can be coated by various coating procedures including wire wound rod coating, dip coating, air knife coating, curtain coating, or extrusion coating using hoppers of the type described in U.S. Pat. No. 2,681,294. If desired, two or more layers can be coated simultaneously by the procedures described in U.S. Pat. No. 2,761,791 and British Patent No. 837,095. Typical wet thickness of the emulsion layer can be about 10–150 micrometers (μm), and the layer can be dried in forced air at a temperature of about 20°–100° C. It is preferred that the thickness of the layer be selected to provide maximum image densities greater than 0.2, and, more preferably, in the range 0.5 to 4.5, as measured by a MacBeth Color Densitometer Model TD 504 using the color filter complementary to the dye color.

Photothermographic elements according to the present invention can contain acutance dyes and antihalation dyes. The dyes may be incorporated into the photo-thermographic emulsion layer as acutance dyes according to known techniques. The dyes may also be incorporated into antihalation layers according to known techniques as an antihalation backing layer, an antihalation underlayer or as an overcoat. It is preferred that the photothermographic elements of this invention contain an antihalation coating on the support opposite to the side on which the emulsion and topcoat layers are coated. Antihalation and acutance dyes useful in the present invention are described in U.S. Pat. Nos. 5,135,842; 5,226,452; 5,314,795.

Development conditions will vary, depending on the construction used, but will typically involve heating the imagewise exposed material at a suitably elevated temperature. When used in a photothermographic element, the latent image obtained after exposure of the heat-sensitive element can be developed by heating the material at a moderately elevated temperature of, for example, about 80°–250° C., preferably about 100°–200° C., for a sufficient period of time, generally about 1 second to about 2 minutes. Heating may be carried out by the typical heating means such as a hot plate, an iron, a hot roller, a heat generator using carbon or titanium white, or the like.

If desired, the imaged element may be subjected to a first heating step at a temperature and for a time sufficient to intensify and improve the stability of the latent image but insufficient to produce a visible image and later subjected to a second heating step at a temperature and for a time sufficient to produce the visible image. Such a method and its advantages are described in U.S. Pat. No. 5,279,928.

When used in a thermographic element, the image may be developed merely by heating at the above noted temperatures using a thermal stylus or print head, or by heating while in contact with a heat absorbing material.

Thermographic elements of the invention may also include a dye to facilitate direct development by exposure to laser radiation. Preferably the dye is an infrared absorbing dye and the laser is a diode laser emitting in the infrared. Upon exposure to radiation the radiation absorbed by the dye is converted to heat which develops the thermographic element.

The Support

Photothermographic and thermographic emulsions used in the invention can be coated on a wide variety of supports. The support, or substrate, can be selected from a wide range of materials depending on the imaging requirement. Supports may be transparent or at least translucent. Typical supports include polyester film, subbed polyester film (e.g., polyethylene terephthalate or polyethylene naphthalate), cellulose acetate film, cellulose ester film, polyvinyl acetal film, polyolefinic film (e.g., polethylene or polypropylene or blends thereof), polycarbonate film and related or resinous materials, as well as glass, paper, and the like. Typically, a flexible support is employed, especially a polymeric film support, which can be partially acetylated or coated, particularly with a polymeric subbing or priming agent. Preferred polymeric materials for the support include polymers having good heat stability, such as polyesters. Particularly preferred polyesters are polyethylene terephthalate and polyethylene naphthalate.

A support with a backside resistive heating layer can also be used photothermographic imaging systems such as shown in U.S. Pat. No. 4,374,921.

Use as a Photomask

As noted above, the possibility of low absorbance of the photothermographic element in the range of 350–450 nm in non-imaged areas facilitates the use of the photothermographic elements of the present invention in a process where there is a subsequent exposure of an ultraviolet or short wavelength visible radiation sensitive imageable medium. For example, imaging the photothermographic element with coherent radiation and subsequent development affords a visible image. The developed photothermographic element absorbs ultraviolet or short wavelength visible radiation in the areas where there is a visible image and transmits ultraviolet or short wavelength visible radiation where there is no visible image. The developed element may then be used as a mask and placed between an ultraviolet or short wavelength visible radiation energy source and an ultraviolet or short wavelength visible radiation photosensitive imageable medium such as, for example, a photopolymer, diazo material, or photoresist. This process is particularly useful where the imageable medium comprises a printing plate and the photothermographic element serves as an imagesetting film.

Objects and advantages of this invention will now be illustrated by the following examples, but the particular materials and amounts thereof recited in these examples, as well as other conditions and details, should not be construed to unduly limit this invention.

EXAMPLES

All materials used in the following examples are readily available from standard commercial sources, such as Aldrich Chemical Co. (Milwaukee, Wis.), unless otherwise specified. All percentages are by weight unless otherwise indicated. The following additional terms and materials were used.

Acryloid™ A-21 is an acrylic copolymer available from Rohm and Haas, Philadelphia, Pa.

Butvar™ B-72, B-76, and B-79 are polyvinyl butyral resins available from Monsanto Company, St. Louis, Mo.

BL2Z is a polyvinyl butyral resin available from Sekisui Chemical Co.

CAB 171-15S is a cellulose acetate butyrate resin available from Eastman Kodak Co.

CAO-5 is bis(2-hydroxy-3-t-butyl-5-methylphenyl-)methane, an antioxidant available from Rohm and Haas, Philadelphia, Pa. It is a reducing agent (i.e., a hindered phenol developer) for the non-photosensitive reducible source of silver and has the following structure:

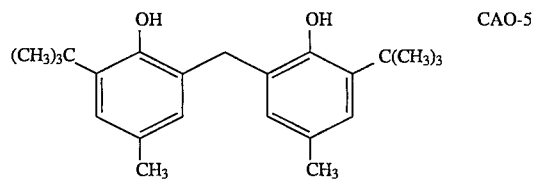

CBBA is 2-(4-chlorobenzoyl)benzoic acid.

Desmodur™ N3300 is an aliphatic hexamethylene diisocyanate available from Mobay Chemicals, Pittsburgh, Pa.

2-MBI is 2-mercaptobenzimidazole.

2-MBO is 2-mercaptobenzoxazole.

2-MBT is 2-mercaptobenzthiazole.

MEK is methyl ethyl ketone (2-butanone).

MeOH is methanol.

MMBI is 5-methyl-2-mercaptobenzimidazole.

PAZ is 1-(2H)-phthalazinone.

4-MPA is 4-methylphthalic acid.

Permanax™ WSO is 1,1-bis(2-hydroxy-3,5-dimethylphenyl)-3,5,5-trimethylhexane [CAS RN=7292-14-0] and is available from St-Jean PhotoChemicals, Inc. Quebec. It is a reducing agent (i.e., a hindered phenol developer) for the non-photosensitive reducible source of silver. It is also known as Nonox.

PET is polyethylene terephthalate.

PHP is pyridinium hydrobromide perbromide.

PHZ is phthalazine.

TCPA is tetrachlorophthalic acid.

Dye-1 has the structure shown below. Its preparation is disclosed in U.S. patent application Ser. No. 08/202, 941 (filed Feb. 28, 1994).

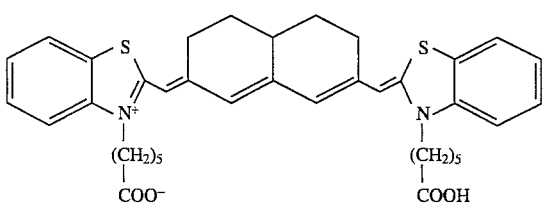

Dye-2 has the structure shown below.

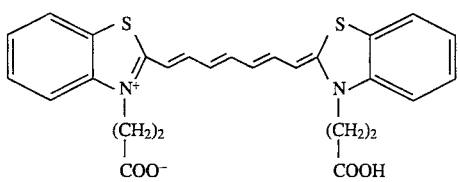

Dye-3 has the structure shown below and is disclosed in U.S. Pat. No. 3,719,495.

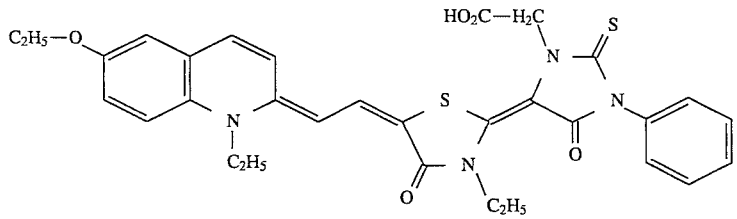

Antifoggant A is 2-(tribromomethylsulfonyl)quinoline. Its preparation is disclosed in U.S. patent application Ser. No. 08/247,65 1 (filed May 23, 4). It has the following structure:

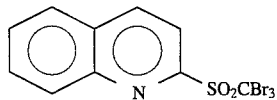

Fluorinated terpolymer A has the following random polymer structure, where m=7, n=2 and p=1. The preparation of fluorinated terpolymer A is described in U.S. patent application Ser. No. 08/104,888 (filed Aug. 10, 1993).

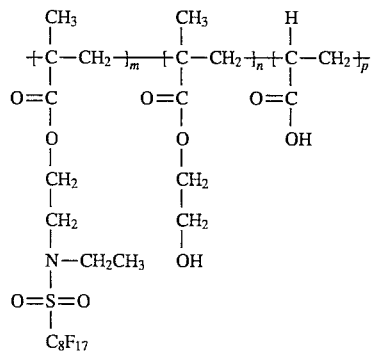

A dual-knife coater was used to coat the dispersions. The support used was 4 mil polyethylene terephthalate. The support was cut to a length suitable to the volume of solution used, and after raising the hinged knives, placed in position on the coater bed. The knives were then lowered and locked into place. The height of the knives was adjusted with wedges controlled by screw knobs and measured with electronic gauges. Knife #1 was raised to a clearance corresponding to the desired wet thickness of the support plus layer #1. Knife #2 was raised to a height equal to the desired wet thickness of the support plus layer #1 plus layer Aliquots of solutions #1 and #2 were simultaneously poured onto the support in front of the corresponding knives. The support was immediately drawn past the knives and into an oven to produce a double layered coating. The coated photothermographic material was then dried by taping the support to a belt which was rotated inside a "BlueM" oven maintained at 80° C. for approximately 2.5 minutes.

The following examples provide exemplary synthetic procedures for compounds of the invention. Photothermographic and thermographic imaging elements are shown.

Hydrazide Syntheses

General Procedure for the Synthesis of Trityl Hydrazides:

Procedure-A: A solution of 126 mmol of the appropriate hydrazide and 222 mmol of $Et_3N$ in 600 mL of acetonitrile was prepared at room temperature. To this was added 126 mmol of chlorotriphenylmethane. The mixture was then heated to 40° C. for approximately 2 hours. The mixture became very thick and stirring became somewhat difficult. The mixture was poured into water and filtered. The solid was then recrystallized from ethanol.

Procedure-B: A mixture of 27.6 g (99 mmol) of chlorotriphenylmethane in 130 mL of DMF was stirred vigorously. To this was added a solution of 13.1 g (99 mmol) of t-butyl carbazate and 15.8 g (200 retool) of triethylamine in 20 mL of DMF dropwise. The mixture was stirred at room temperature for several hours. The mixture was filtered and while the filtrate was stirred vigorously, approximately 300 mL of ice water was added. The solid thus precipitated was filtered off and recrystallized from methanol.

Procedure-C: A solution of 30 mmol of the appropriate hydrazide and 30 mmol of chlorotriphenylmethane in 100 mL of pyridine was prepared and stirred. After stirring at room temperature for several hours, the mixture was poured into water. The solid was collected by filtration and washed thoroughly with water. The solid was then recrystallized from ethanol to provide the desired triphenylmethyl hydrazide.

Compound H-1 was prepared according to General Procedure-A described above, using 10.0 g of octanoic hydrazide, 8.8 g of triethylamine, 17.6 g of trityl chloride and 316 mL of acetonitrile. The normal workup procedure was followed and yielded 17.0 g (67%) of the desired product.

Compounds H-2, H-3, H-5, and H-25 were synthesized according to General Procedure-C.

Compound H-4 was prepared according to General Procedure-A using 10.0 g of benzoic hydrazide, 7.1 g of triethylamine, 20.5 g of trityl chloride and 150 mL of acetonitrile. The mixture was heated to 50° C. for 2 hours, then worked up in the normal fashion. The solid was then recrystallized to provide 11.5 g (41% yield) of the desired product.

Compound H-6 was prepared according to General Procedure-A, using 5.0 g of 3-hydroxybutyric acid hydrazine, 4.35 g of triethylamine, 11.8 g of trityl chloride and 250 mL of acetonitrile. The mixture was heated for 2 hours then was cooled and poured into ice water. The solid then isolated was recrystallized from 1:1 hexane:ethyl acetate to provide the desired compound, m.p. 148°–150° C.

Compound H-7 was prepared according to General Procedure-A using 5.0 g of 4-nitrophenoxyacetic acid hydrazide, 4.0 g of triethylamine, 6.6 g of trityl chloride and 100 mL of acetonitrile. Normal workup and recrystallization provided 3.0 g (30% yield) of the desired product.

Compound H-8 was prepared according to General Procedure-A using 3.55 g of 2-thiophenecarboxylic acid, 3.16 g of triethylamine, 6.96 g of trityl chloride, and 150 mL of acetonitrile. The normal workup procedure was followed to provide 5.5 g (57% yield) of the desired compound, m.p. 185°–190° C.

Compound H-9 was prepared according to General Procedure-A using 10.0 g of isonicotinic acid hydrazide, 7.9 g of triethylamine, 20.3 g of trityl chloride and 400 mL of acetonitrile. The mixture was heated for 2 hours at 50° C. The normal workup procedure was followed to provide 10.7 g (37% yield) of the desired product as colorless, cubic crystals, m.p. 192°–194° C.

Compound H-10 was prepared according to General Procedure-B. t-Butyl carbazate (5.0 g) and of triethylamine (3.8 g) were dissolved in 45 mL of N,N-dimethylformamide (DMF). To this was added 10.5 g of trityl chloride in 4.5 mL of DMF. This was stirred overnight at room temperature then filtered. The remaining liquid was stirred vigorously while adding water slowly. A sticky yellowish mass resulted. The water was poured off and the solid was recrystallized from MeOH to provide the desired product as an off-white solid, 7.8 g (55% yield), m.p. 119°–122° C.

Compound B-11 was prepared according to General Procedure-A using 5.7 g of phenylacetylhydrazine, 3.6 g of triethylamine, 10.6 g of trityl chloride and 50 mL of acetonitrile. The mixture immediately became very thick with a white precipitate. The mixture was heated for 1 hour at 50° C., then the normal workup was followed. Recrystallization from 1:1 MeOH:EtOH provided 7.0 g of the desired product (47% yield).

Compound H-12 was prepared in an analogous manner to H-10.

Compounds H-13, H-20, H-21, H-22, H-23, H-24, H-26, H-27, and H-28 were also synthesized according to General Procedure-A from the appropriate hydrazine and appropriate trityl chloride.

Synthesis of Formylphenylhydrazines:

Compound H-14 (1-Formyl-2-phenylhydrazine) was prepared by the method outlined in *J. Chem. Soc.* 1950, 3389. Phenylhydrazine 50.0 g (462 mmol) was added slowly to acetic acid 70 g (2.444 mol) maintained at 0° C. in an ice bath. Formamide (10.5 g, 466 mmol) was added dropwise so as not to cause warming. The mixture gradually warmed to room temperature and was stirred for several hours. The mixture was poured into water and filtered. The solid was washed with very dilute acetic acid and then water. The crude material was dried and recrystallized from 200 mL of ethanol to provide 30 g (60% yield) of the desired compound as white, platelike crystals, m.p. 142°–44° C.

Compounds H-16, is available from Aldrich Chemical Co. Compound H-15 was synthesized in a similar manner as described for the preparation of H-17.

Compound H-17 (1-Formyl-2-(4-methoxyphenyl)hydrazine) was prepared by addition of 5.0 g (28.8 mmol) of 4-methoxyphenylhydrazine hydrochloride to a cooled solution of 18.0 g of acetic acid, followed by addition of 2.61 g (58.0 mmol) formamide. The mixture was stirred for 3 hours and poured into water. The water was extracted with $Et_2O$ and the etheral layer separated and dried over $Na_2SO_4$. Filtration and concentration of the solution afforded 1.65 g (38% yield) of the desired compound.

Synthesis of Comparative Compounds

Compound C-1 was prepared from 8.6 g of phenylhydrazine, 6.3 g of triethylamine, 11.1 g of trityl chloride and 100 mL of THF. Normal reaction and workup procedures were followed, recrystallization from 1:1 hexane:toluene provided 3.7 g (57% yield) of the desired product as a yellowish solid, m.p. 102°–104° C.

Compound C-3 [1-(2-hydroxymethylbenzoyl)-2-phenylhydrazine]was prepared by heating a mixture of 33.0 g (246 retool) of phthalide and 27 mL (249 mmol) of phenylhydrazine at reflux for several hours. The mixture was cooled and filtered. The solid was recrystallized from 2-propanol to provide the desired product, m.p. 184°–5° C.

Compound C-4 (1-Benzoyl-2-phenylhydrazine) was prepared by heating a mixture of 20.0 g (88.5 mmol) of benzoic acid anhydride and 9.47 g (88.5 mmol) phenylhydrazine in 100 mL of toluene at reflux for several hours. After cooling, the mixture (containing solid) was poured into ice water. A slightly orange material was isolated, dried, and recrystallized from hot ethanol to provide long, white needles which were filtered off from the supernatant, m.p. 169°–171 ° C.

Compound C-5 [1-(1-pyridiniumacetyl)-2-phenylhydrazine chloride]was prepared by reaction of a solution of 9.4 g (100 mmol) chloroacetic acid and 10.8 g (100 mmol) of phenylhydrazine was dissolved in 50 mL of THF. To this was added 20.0 g (100 mmol) of DCC. The mixture was stirred at room temperature. The mixture was filtered and the solid was washed with THF. The organic solution was concentrated and the remaining residue was taken up in 50 mL of pyridine. After stirring overnight, a thick peach-colored mixture was obtained. This was filtered and rinsed several times with ethanol. The cream-colored solid was then dried under high vacuum and the crude material was tested.

Compound C-6 was prepared in a manner similar to Compound C-3 from phthalic anhydride and phenyl hydrazine.

Compound C-7 was prepared by reaction of phenylthiosemicarbazide and trityl chloride in a manner analogous to that for the other trityl compounds.

The structures of the hydrazide compounds prepared as described above and used in comparative examples are shown below.

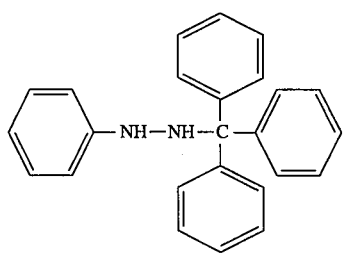

C-1

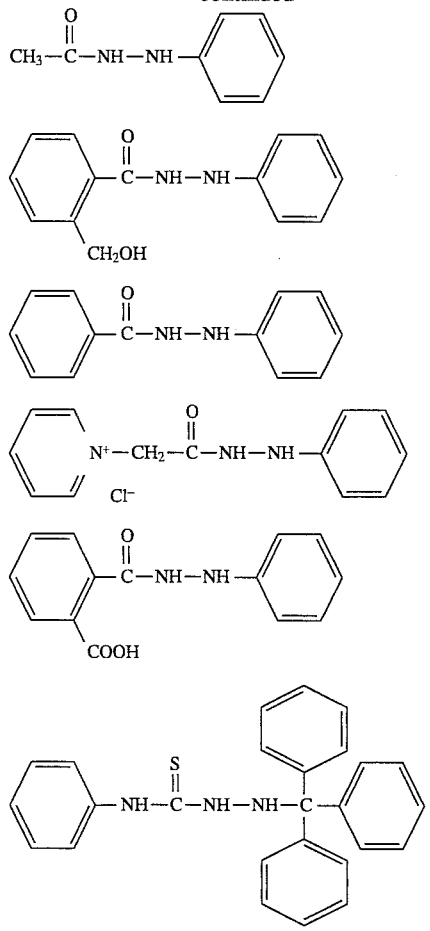

The preparation of a pre-formed silver iodobromide emulsion, silver soap dispersion, homogenate, and halidized homogenate solutions used in Examples 1–8 are described below.

Formulation A: A dispersion of silver behenate full soap containing pre-formed silver halide grains (0.05 μm, AgX= 98%/2%, Br/I, 4 wt % overall) was homogenized to 19.1% solids in 2-butanone and toluene (90/10) containing 1.83% polyvinyl butyral (Sekisui BL2Z) resin. To 298.0 g of the silver full soap dispersion was added 1.39 mL of a pyridinium hydrobromide perbromide solution (prepared by dissolving 0.849 g of pyridinium hydrobromide perbromide in 2.38 g methanol). After 2 hours of mixing 1.39 mL of a calcium bromide solution was added (prepared by dissolving 0.641 g in 2.28 g of methanol) and 44.9 g of BL2Z polyvinyl butyral was added 30 minutes later. After 1 hour of mixing, the temperature of the solution was lowered from 70° F. to 55° F. and held overnight. The next day the solution temperature was raised to 70° F. and 10.06 g of Permanax™ was added. After 15 minutes, 1.69 g of Antifoggant A was added along with 2.12 g of a solution of Desmodur™ N3300 (prepared by dissolving 2.465 g of Desmodur™ N3300 in 2.1 g of 2-butanone).

To 235 g of the prepared silver premix described above was added the following infrared sensitizing dye mixture:

| Material | Amount |
| --- | --- |
| CBBA | 1.43 g |
| Dye-2 | 0.0075 g |
| 2-MBI | 0.08 g |
| 2-MBT | 0.04 g |
| Methanol | 14.4 g |

After 4 hours, $1.0 \times 10^3$ mol of hydrazide dissolved in 1.5 g of tetrahydrofuran was added to a 15 g aliquot of the infrared sensitized silver premix. A topcoat solution was prepared in the following manner; 1.29 g of Acryloid™ A-21 polymethyl methacrylate and 33.57 g of cellulose acetate butyrate (CAB 171-15S available from Eastman Kodak) were mixed until dissolved in 404.7 g methyl ethyl ketone and 53.4 g of methanol. To this premix was then added 1.29 g 4-methylphthalic acid, 0.86 g tetrachlorophthalic acid, 2.64 g phthalazine, and 2.32 g of a 15.0% solution of fluorinated terpolymer A in ethyl acetate.

The hydrazide containing silver layer and topcoat were each dual-knife coated with the gaps set at of 4.7 mil and 6.2 mil, respectively on a 4 mil polyester base and dried for 3 to 5 minutes at 175° F. The polyester support had an antihalation coating on the side opposite to the side on which the emulsion and topcoat layers were coated. The samples were exposed using a 810 nm laser diode sensitometer for 6 seconds. The coatings were processed on a roll processor for 7 to 24 seconds at 240 to 250° F.

Formulation B: A dispersion of silver behenate full soap containing pre-formed core-shell silver halide grains (0.05 μm, AgX=98%/2%, Br/I, 2 weight % overall, 1/4 I/Br core and 3/4 Br shell with 8% I in core) was homogenized to 19.1% solids in methyl ethyl ketone and toluene (99/1) and containing 1.83% Butvar™ B-79 polyvinyl butyral resin. To 298.0 g of the silver full soap dispersion was added 1.39 mL of pyridinium hydrobromide perbromide solution (prepared by dissolving 0.849 g of PHP in 2.38 g of MeOH). After 2 hours of mixing 1.39 mL of a calcium bromide solution was added (prepared by dissolving 0.641 g CaBr$_2$ in 2.28 g of MeOH). Butvar™ B-79 (44.9 g) was added 30 minutes later. After 1 hour of mixing, the temperature of the solution was lowered from 70° F. to 55° F. and held overnight. The next day the solution temperature was raised to 70° F. and 10.06 g of Permanax™ was added. After 15 minutes 1.69 g of Antifoggant A was added along with 2.12 g of a solution of Desmodur™ N3300 (prepared by dissolving 2.465 g of Desmodur™ N3300 in 2.1 g of 2-butanone).

To 235 g of the prepared silver premix described above was added the following infrared sensitizing dye mixture:

| Material | Amount |
| --- | --- |
| CBBA | 1.43 g |
| Dye-1 | 0.0292 g |
| Dye-2 | 0.0075 g |
| 2MBI | 0.08 g |
| 2MBT | 0.04 g |
| Methanol | 14.4 g |

After 4 hours, 1.0 to $2.0 \times 10^{-5}$ moles of the hydrazide was added as a methanol solution to a 15 g aliquot of the infrared sensitized silver premix. Also added was 0.06 g of phthalazinone (PAZ) in 1.5 g of tetrahydrofuran. A topcoat solution was prepared in the following manner: 1.29 g of Acryloid™ A-21 polymethyl methacrylate and 33.57 g of cellulose acetate butyrate (CAB 171-15S) were mixed until dissolved in 404.7 g methyl ethyl ketone and 53.4 g of methanol. To this premix was then added 1.29 g 4-methylphthalic acid, 0.86 g tetrachlorophthalic acid, 2.64 g phthalazine, and 2.32 g of a 15.0% solution of fluorinated terpolymer A in ethyl acetate. The 8.0% solids topcoat was diluted to 6.0% solids with the addition of 2-butanone. The hydrazide containing silver layer and topcoat were each coated at a wet thickness of 5.2 mils and 7.7 mils, respectively on a 4 mil polyester support containing an antihalation backcoat and dried for 5 minutes at 175° F. The polyester support had an antihalation coating on the side opposite to the side on which the emulsion and topcoat layers were coated. The samples were exposed using a 810 nm laser diode sensitometer for 6 seconds. The coatings were processed on a roll processor for 7 to 24 seconds at 250° F.

The preparation of an iridium-doped, pre-formed core-shell silver iodobromide emulsion, silver soap dispersion, homogenate, and homogenate emulsion used in Examples 9–16 is described below.

Formulation C: A dispersion of silver behenate full soap containing pre-formed Iridium-doped ($1 \times 1~10^{-5}$ moles) core-shell silver halide grains (0.042 μm, AgX=98%/2%, Br/I, 2 weight %; 1/4 I/Br core and 3/4 Br shell with 8% I in core) was homogenized to 19.1% solids in 2-butanone and toluene (99/1) and containing 2.2% Butvar™ B-79 resin. The silver premix was prepared in the same manner as described in Formulation B.

To 76.0 g of the prepared silver premix described above was added the following red sensitizing dye mixture:

| Material | Amount |
| --- | --- |
| CBBA | 0.425 g |
| Dye 3 | 0.0021 g |
| 2MBI | 0.0238 g |
| 2MBT | 0.0119 g |
| Toluene | 3.21 g |
| Methanol | 1.07 g |

The hydrazide was added and coated as described in Formulation B, but dried for 5 minutes at 185° C. The topcoat was prepared as described in Formulation A. Photothermographic elements were prepared by dual-knife coating the silver layer and topcoat onto a polyester support. The polyester support had an anti-halation coating on the side opposite to the side on which the photothermographic emulsion and topcoat were coated (referred to as the backcoat). The coatings were exposed and processed as described above.

Formulation D: A dispersion of silver behenate full soap containing preformed iridium doped ($1 \times 10^{-5}$ mol) core-shell silver halide grains (0.042 μm; AgX=98%/2%, Br/I; 2 wt %, 1/4 I/Br core and 3/4 Br shell with 8% I in core was homogenized to 23.0% solids in 2-butanone and toluene (99/1) and containing 2.2% Butvar™ B-79 resin. To 13 1.4 g of the silver full soap dispersion was added 0.74 mL of a solution of pyridinium hydrobromide perbromide (prepared by dissolving 0.42g of pyridinium hydrobromide perbromide in 2.35 g of MeOH). After 60 minutes of mixing, 0.74 mL of a calcium bromide solution was added (prepared by dissolving 0.632 g of CaBr$_2$ in 2.3 g of MeOH). After 30 minutes, the following sensitizing dye solution was added:

| Material | Amount |
| --- | --- |
| CBBA | 1.20 g |
| Dye 3 | 0.0029 g |
| 2MBI | 0.0672 g |
| 2MBT | 0.0336 g |
| Toluene | 4.53 g |
| MeOH | 1.5 g |

After 1 hour of mixing, the temperature was lowered from 70° F. to 55° F. After 30 minutes at 55° F., 23.85 g of Butvar™ B-79 was added. Vigorous stirring for 60 minutes was followed by addition of the following components every 15 minutes.

| Material | Amount |
| --- | --- |
| Antifoggant A | 0.90 g |
| Permanax ™ | 7.39 g |
| N-3300 | 0.608 g dissolved in |
| MEK | 0.608 g |
| PHZ | 0.986 g |
| TCPA | 0.444 g |

The cellulose acetate butyrate (CAB) topcoat was prepared in the same manner as Formulation B, except to 197.2 g of this solution was added 0.516 g of 4-methylphthalic acid and 0.928 g of a 15.0% solution of Fluorinated Terpolymer A in ethyl acetate. These layers were dual-knife coated with the orifice set at 4.2 mil for the silver layer and 5.7 mil for the topcoat layer. The coating was dried at 185° C. for 5 minutes. The polyester support had an antihalation coating on the side opposite to side on which the emulsion and topcoat layers were coated. The coatings were exposed and processed as described in Formulation B.

Formulation E: A dispersion of silver behenate full soap containing pre-formed iridium-doped ($1 \times 10^{-5}$ moles) core-shell silver halide grains (0.042 μm; AgX=98/2% Br/I 2 wt%, 1/4 I/Br core and 3/4 Br shell with 8% I in the core) was homogenized to 23.0% solids in 2-butanone and contained 2.2% Butvar™ B-79. To 262.8 g of the silver full soap dispersion was added 1.48 mL of a pyridinium hydrobromide perbromide solution (prepared by dissolving 0.42 g of PHP in 2.35 g MeOH). After 1 hour of mixing 1.48 mL of a calcium bromide solution was added (prepared by dissolving 0.632g of CaBr$_2$ in 2.35 g of MeOH). After 30 minutes, a solution of infrared sensitizing Dye-1 was added.

| Material | Amount |
| --- | --- |
| CBBA | 3.58 g |
| Dye 1 | 0.0735 g |
| 2MBI | 0.0672 g |
| 2MBO | 0.0252 g |
| MeOH | 12.088 g |

After 1 hour of mixing, the temperature was lowered from 70° F. to 55° F. After 30 minutes at 55° F., 47.69 g of Butvar™ B-79 was added. After vigorous stirring for 1 hour, the following components were added every 15 minutes:

| Material | Amount |
| --- | --- |
| Antifoggant A | 1.794 g |
| Permanax ™ | 14.79 g |
| N3300 | 1.215 g dissolved in |
| MEK | 1.215 g |

| Material | Amount |
|---|---|
| PHZ | 1.479 g dissolved in |
| MeOH | 1.75 g |
| TCPA | 0.666 g dissolved in |
| MEK | 2.625 g |

To 197.2 g of the cellulose acetate butyrate topcoat solution described in Formulation B was added 0.516 g of 4-MPA, 0.928 g of a 15% solution of fluorinated terpolymer A in ethyl acetate, and 42.5 g of 2-butanone. The photothermographic emulsion and topcoat layers were dual-knife coated onto a 4 mil polyester support containing an antihalation back coat. The knife gap was set at 4.7 mil for the silver layer and 6.7 mil for the topcoat layer. The coating was dried at 185° C. for 5 minutes to form a photothermographic element. The photothermographic elements were exposed and developed as described previously.

Sensitometry: Sensitometry measurements were made on a custom built computer scanned densitometer using a filter appropriate to the sensitivity of the photothermographic element and are believed to be comparable to measurements from commercially available densitometers.

Speed-2 is Log1/E +4 corresponding to the density value of 1.00 above Dmin where E is the exposure in ergs/cm$^2$.

Speed-5 is Log1/E +4 corresponding to a density value of 3.00 above Dmin where E is the exposure in ergs/cm$^2$.

Contrast-A is the absolute value of the slope of the line joining the density points of 0.07 and 0.17 above Dmin.

Contrast-D is the absolute value of the slope of the line joining the density points of 1.00 and 3.00 above Dmin.

Example 1

To 15 g aliquots of the infrared sensitized silver premix prepared in Formulation A were added 1.0×10$^{-3}$ mol of hydrazide H-1 or H-2. Duplicate samples were prepared both with and without the addition of 0.06 g phthalazinone.

The effects on the sensitometric response by the addition of the trityl hydrazides to the Permanax™ developer with or without the presence of the phthalazinone (PAZ) toner are summarized below for various processing conditions.

As shown by the examples below, the addition of the hydrazides having a trityl group enhance the contrast, speed, and Dmax of the photothermographic element, and generate a sensitometric response in an infrared sensitized system similar to those observed for infectious development in photographic silver halide technology. The addition of the PAZ toner further enhanced this development.

| Ex. | Developer | Processing Conditions | Dmin | Dmax |
|---|---|---|---|---|
| 1-1 | Permanax ™ | 15 sec/250° F. | 0.26 | 2.89 |
| 1-2 | Permanax ™ | 19 sec/250° F. | 0.26 | 3.38 |
| 1-3 | Permanax ™ | 24 sec/250° F. | 0.29 | 3.31 |
| 1-4 | Permanax ™ + PAZ | 15 sec/280° F. | 0.24 | 3.33 |
| 1-5 | Permanax ™ + PAZ | 19 sec/280° F. | 0.25 | 3.37 |
| 1-6 | Permanax ™ + PAZ | 24 sec/280° F. | 0.28 | 3.38 |
| 1-7 | Permanax ™ + H-1 | 15 sec/280° F. | 0.26 | 4.61 |
| 1-8 | Permanax ™ + H-1 | 19 sec/280° F. | 0.26 | 4.83 |
| 1-9 | Permanax ™ + H-1 | 24 sec/280° F. | 0.28 | 4.99 |
| 1-10 | Permanax ™ + PAZ + H-1 | 15 sec/280° F. | 0.25 | 4.55 |
| 1-11 | Permanax ™ + PAZ H-1+ | 19 sec/280° F. | 0.27 | 4.75 |
| 1-12 | Permanax ™ + PAZ H-1+ | 24 sec/280° F. | 0.28 | 4.73 |
| 1-13 | Permanax ™ + H-2 | 15 sec/250° F. | 0.26 | 3.68 |
| 1-14 | Permanax ™ + H-2 | 19 sec | 0.28 | 4.00 |
| 1-15 | Permanax ™ + H-2 | 24 sec/250° F. | 0.30 | 4.16 |
| 1-16 | Permanax ™ + PAZ H-2 | 15 sec/250° F. | 0.27 | 3.88 |
| 1-17 | Permanax ™ + PAZ H-2 | 19 sec/250° F. | 0.28 | 4.14 |
| 1-18 | Permanax ™ + PAZ H-2 | 24 sec/250° F. | 0.31 | 4.30 |

| Ex. | Speed-2 | Speed-5 | Contrast-A | Contrast-D |
|---|---|---|---|---|
| 1-1 | 0.86 | — | 0.77 | — |
| 1-2 | 0.96 | 0.12 | 0.70 | 2.39 |
| 1-3 | 1.04 | 0.15 | 0.75 | 2.21 |
| 1-4 | 1.00 | 0.17 | 0.86 | 2.40 |
| 1-5 | 1.09 | 0.18 | 0.81 | 2.22 |
| 1-6 | 1.16 | 0.20 | 0.93 | 2.09 |
| 1-7 | 0.91 | 0.59 | 0.80 | 6.29 |
| 1-8 | 1.02 | 0.77 | 0.73 | 7.92 |
| 1-9 | 1.09 | 0.98 | 0.74 | 18.14 |
| 1-10 | 1.14 | 1.04 | 0.72 | 20.27 |
| 1-11 | 1.29 | 1.21 | 0.78 | 22.80 |
| 1-12 | 1.35 | 1.26 | 0.78 | 21.74 |
| 1-13 | 1.19 | 1.04 | 0.71 | 13.69 |
| 1-14 | 1.26 | 1.13 | 0.96 | 15.65 |
| 1-15 | 1.40 | 1.32 | 0.95 | 26.21 |
| 1-16 | 1.09 | 0.97 | 0.72 | 17.77 |
| 1-17 | 1.26 | 1.17 | 0.77 | 22.21 |
| 1-18 | 1.36 | 1.29 | 0.73 | 28.97 |

Example 2

To the same 15 g aliquot silver premix prepared as Formulation A, except with the addition of a different infrared sensitizing dye mixture as shown below, was added 1.0×10$^{-3}$ mol of trityl hydrazides H-1, H-2, H-3 and H-4 or 0.5×10$^{-3}$ mol of tritylhydrazide H-5 and 0.06 g of PAZ.

| Material | Amount |
|---|---|
| Formulation A | 235. g |
| CBBA | 1.43 g |
| Dye-1 | 0.0292 g |
| MMBI | 0.12 g |
| Methanol | 6.11 g |

The hydrazide containing silver layer and topcoat were each coated, exposed and processed as described in Formulation A. The sensitometry of these coatings at various processing conditions are shown below.

As shown by the examples below, contrast, speed, and Dmax of the photothermographic elements were enhanced by the addition of various trityl hydrazides to the photothermographic element containing a hindered phenol developer.

| Ex. | Developer | Processing Conditions | Dmin | Dmax |
|---|---|---|---|---|
| 2-1 | Permanax ™ + PAZ | 13 sec/240° F. | 0.33 | 3.44 |
| 2-2 | Permanax ™ + PAZ | 7 sec/250° F. | 0.30 | 2.97 |
| 2-3 | Permanax ™ + PAZ | 11 sec/250° F. | 0.34 | 4.80 |
| 2-4 | Permanax ™ + PAZ | 15 sec/250° F. | 0.33 | 4.75 |
| 2-5 | Permanax ™ + | 7 sec/250° F. | 0.29 | 3.89 |

|   | | | | |
|---|---|---|---|---|
| 2-6 | Permanax ™ + PAZ + H-1 | 11 sec/250° F. | 0.38 | 4.91 |
| 2-7 | Permanax ™ + PAZ + H-3 | 7 sec/250° F. | 0.27 | 3.61 |
| 2-8 | Permanax ™ + PAZ + H-3 | 11 sec/250° F. | 0.30 | 4.59 |
| 2-9 | Permanax ™ + PAZ + H-3 | 15 sec/250° F. | 0.33 | 4.50 |
| 2-10 | Permanax ™ + PAZ + H-4 | 7 sec/250° F. | 0.35 | 4.83 |
| 2-11 | Permanax ™ + PAZ + H-4 | 9 sec/250° F. | 0.46 | 5.11 |
| 2-12 | Permanax ™ + PAZ + H-2 | 7 sec/250° F. | 0.31 | 3.67 |
| 2-13 | Permanax ™ + PAZ + H-2 | 11 sec/250° F. | 0.34 | 4.74 |
| 2-14 | Permanax ™ + PAZ + H-2 | 15 sec/250° F. | 0.37 | 4.62 |
| 2-15 | Permanax ™ + PAZ + H-5 | 11 sec/250° F. | 0.30 | 4.75 |
| 2-16 | Permanax ™ + PAZ + H-5 | 13 sec/250° F. | 0.35 | 5.18 |

| Ex. | Speed-2 | Speed-5 | Contrast-A | Contrast-D |
|---|---|---|---|---|
| 2-1 | 1.40 | 0.45 | 0.53 | 2.11 |
| 2-2 | 1.43 | — | 0.60 | — |
| 2-3 | 1.81 | 1.27 | 0.61 | 3.68 |
| 2-4 | 1.99 | 1.54 | 0.61 | 4.51 |
| 2-5 | 1.61 | 0.74 | 0.41 | 2.29 |
| 2-6 | 2.07 | 1.88 | 0.41 | 10.33 |
| 2-7 | 1.61 | 0.62 | 0.69 | 2.03 |
| 2-8 | 1.97 | 1.73 | 0.61 | 8.80 |
| 2-9 | 2.27 | 2.15 | 0.67 | 17.12 |
| 2-10 | 1.82 | 1.43 | 0.52 | 5.22 |
| 2-11 | 2.24 | 2.04 | 0.51 | 10.13 |
| 2-12 | 1.51 | 0.55 | 0.57 | 2.24 |
| 2-13 | 1.92 | 1.65 | 0.56 | 7.45 |
| 2-14 | 2.13 | 1.99 | 0.59 | 14.62 |
| 2-15 | 1.83 | 1.53 | 0.64 | 6.68 |
| 2-16 | 2.14 | 1.92 | 0.74 | 9.13 |

Example 3

As described above in Formulation A, $0.25 \times 10^{-3}$, $0.50 \times 10^{-3}$, or $1.0 \times 10^{-3}$ mol of H-1 was added with 0.06 g of PAZ to a 15.0 g aliquot of an infrared sensitized silver premix solution using the following sensitizing dye mixture:

| Material | Amount |
|---|---|
| Silver Premix | 235. g |
| CBBA | 1.43 g |
| Dye-1 | 0.0292 g |
| Dye-2 | 0.0075 g |
| 2-MBI | 0.08 g |
| 2-MBT | 0.04 g |
| Methanol | 14.4 g |

The silver layer and topcoat were coated, exposed and processed as described above. The sensitometric response is shown below. These results show the enhanced contrast that was observed as a function of trityl hydrazide concentration added to the Permanax™ developer solution. These contrasts were similar to those observed for black-and-white infectious development photographic materials in wet silver halide technology.

| Ex. | Developer | Processing Conditions | Dmin | Dmax |
|---|---|---|---|---|
| 3-1 | Permanax ™ + PAZ | 15 sec/250° F. | 0.30 | 4.68 |
| 3-1 | Permanax ™ + $1.0 \times 10^{-3}$ mol H-1 + PAZ | 15 sec/250° F. | 0.30 | 5.19 |
| 3-3 | Permanax ™ + $0.5 \times 10^{-3}$ mol H-1 + PAZ | 15 sec/250° F. | 0.32 | 4.78 |
| 3-4 | Permanax ™ + $0.25 \times 10^{-3}$ mol H-1 + PAZ | 15 sec/250° F. | 0.28 | 4.55 |

| Ex. | Speed-2 | Speed-5 | Contrast-A | Contrast-D |
|---|---|---|---|---|
| 3-1 | 1.59 | 1.19 | 0.82 | 5.02 |
| 3-2 | 1.87 | 1.79 | 1.02 | 24.57 |
| 3-3 | 1.72 | 1.62 | 0.79 | 20.53 |
| 3-4 | 1.60 | 1.27 | 0.87 | 6.00 |

Example 4

As described in Example 3, the same sensitizing dye premix was used except the Permanax™ developer was omitted and Butvar™ B-79 polyvinyl butyral was substituted for the Sekisui BL2Z polyvinyl butyral. The topcoat solution was also the same as in Example 3 but was diluted from 8.0% solids to 6.0% solids with 2-butanone. To a 14.6 g aliquot of the dye sensitized silver premix was added $0.50 \times 10^{-3}$ to $1.5 \times 10^{-3}$ mol of Permanax™ or CAO-05 developer in a solution containing 1.5 g tetrahydrofuran and 0.06 g PAZ. Coatings were prepared with and without the addition of $1.0 \times 10^{-3}$ mol of the trityl hydrazide H-1. The silver and topcoat solutions were coated at wet thickness of 5.2 mil and 7.7 mil, respectively.

The sensitometric response for these photothermographic elements, shown below, demonstrates that the addition of a trityl hydrazide to hindered phenol developers enhances the contrast, speed, and Dmax of the photothermographic elements.

| Ex. | Developer | Processing Conditions | Dmin | Dmax |
|---|---|---|---|---|
| 4-1 | Permanax ™ $0.75 \times 10^{-3}$ mol | 15 sec/250° F. | 0.25 | 4.12 |
| 4-2 | Permanax ™ $0.75 \times 10^{-3}$ mol | 19 sec/250° F. | 0.26 | 4.08 |
| 4-3 | Permanax ™ $0.75 \times 10^{-3}$ mol | 23 sec/250° F. | 0.28 | 4.00 |
| 4-4 | Permanax ™ $0.75 \times 10^{-3}$ mol + H-1 | 15 sec/250° F. | 0.26 | 4.87 |
| 4-5 | Permanax ™ $0.75 \times 10^{-3}$ mol + H-1 | 19 sec/250° F. | 0.29 | 5.18 |
| 4-6 | Permanax ™ $0.75 \times 10^{-3}$ mol + H-1 | 23 sec/250° F. | 0.32 | 5.03 |
| 4-7 | Permanax ™ $1.00 \times 10^{-3}$ mol | 15 sec/250° F. | 0.29 | 4.67 |
| 4-8 | Permanax ™ $1.00 \times 10^{-3}$ mol | 19 sec/250° F. | 0.32 | 4.55 |
| 4-9 | Permanax ™ $1.00 \times 10^{-3}$ mol | 23 sec/250° F. | 0.37 | 4.31 |
| 4-10 | Permanax ™ $1.00 \times 10^{-3}$ mol + H-1 | 15 sec/250° F. | 0.28 | 5.06 |

-continued

| | | | | |
|---|---|---|---|---|
| 4-11 | Permanax ™ 1.00 × 10⁻³ mol + H-1 | 19 sec/250° F. | 0.30 | 5.00 |
| 4-12 | Permanax ™ 1.00 × 10⁻³ mol + H-1 | 23 sec/250° F. | 0.38 | 5.21 |
| 4-13 | Permanax ™ 1.5 × 10⁻³ mol | 15 sec/250° F. | 0.32 | 4.55 |
| 4-14 | Permanax ™ 1.5 × 10⁻³ mol | 19 sec/250° F. | 0.40 | 4.42 |
| 4-15 | Permanax ™ 1.5 × 10⁻³ mol + H-1 | 15 sec/250° F. | 0.38 | 5.18 |
| 4-16 | Permanax ™ 1.5 × 10⁻³ mol + H-1 | 19 sec/250° F. | 0.48 | 5.18 |
| 4-17 | CAO-5 0.5 × 10⁻³ mol | 15 sec/250° F. | 0.33 | 4.62 |
| 4-18 | CAO-5 0.5 × 10⁻³ mol | 19 sec/250° F. | 0.36 | 4.60 |
| 4-19 | CAO-5 0.5 × 10⁻³ mol | 23 sec/250° F. | 0.43 | 4.50 |
| 4-20 | CAO-5 0.5 × 10⁻³ mol + H-1 | 15 sec/280° F. | 0.36 | 4.87 |
| 4-21 | CAO-5 0.5 × 10⁻³ mol + H-1 | 19 sec/280° F. | 0.41 | 4.91 |
| 4-22 | CAO-5 0.5 × 10⁻³ mol + H-1 | 23 sec/280° F. | 0.49 | 5.11 |

| Ex. | Speed-2 | Speed-5 | Contrast-A | Contrast-D |
|---|---|---|---|---|
| 4-1 | 1.75 | 1.10 | 0.87 | 3.09 |
| 4-2 | 1.80 | 1.17 | 0.86 | 3.21 |
| 4-3 | 1.85 | 1.24 | 0.92 | 3.29 |
| 4-4 | 1.88 | 1.75 | 0.76 | 14.25 |
| 4-5 | 2.08 | 1.98 | 1.06 | 20.98 |
| 4-6 | 2.27 | 2.19 | 1.21 | 24.53 |
| 4-7 | 1.78 | 1.31 | 0.88 | 4.31 |
| 4-8 | 1.82 | 1.35 | 0.82 | 4.31 |
| 4-9 | 1.89 | 1.36 | 0.92 | 3.72 |
| 4-10 | 2.10 | 2.00 | 0.86 | 20.49 |
| 4-11 | 2.22 | 2.14 | 1.02 | 25.22 |
| 4-12 | 2.40 | 2.30 | 1.11 | 21.08 |
| 4-13 | 1.80 | 1.37 | 0.76 | 4.71 |
| 4-14 | 1.97 | 1.29 | 0.81 | 2.94 |
| 4-15 | 2.18 | 2.11 | 0.85 | 26.07 |
| 4-16 | 2.37 | 2.27 | 1.06 | 20.06 |
| 4-17 | 1.91 | 1.28 | 0.85 | 3.15 |
| 4-18 | 1.95 | 1.38 | 0.72 | 3.50 |
| 4-19 | 1.97 | 1.42 | 0.87 | 3.64 |
| 4-20 | 2.02 | 1.86 | 0.77 | 12.77 |
| 4-21 | 2.18 | 2.06 | 0.68 | 17.92 |
| 4-22 | 2.26 | 2.17 | 0.96 | 21.01 |

Example 5

To 15.0 g aliquots of the dye sensitized silver premix of Formulation B was added 6.25×10⁻⁵ mol to 1.00×10⁻³ mol of the trityl hydrazides H-1, H-4, H-6, H-7, H-8, or H-9 and PAZ.

The sensitometric response for these coatings, shown below, demonstrates that the addition of various trityl hydrazides to a core-shell emulsion containing a hindered phenol developer enhances Dmax, speed, and contrast of the photo-thermographic elements. The ultra high contrast achieved in these materials is similar to that observed in traditional photographic hard dot imagesetting films.

| Ex. | Developer | Processing Conditions | Dmin | Dmax |
|---|---|---|---|---|
| 5-1 | Permanax ™ | 15 sec/250° F. | 0.21 | 4.26 |
| 5-2 | Permanax ™ + 1.25 × 10⁻⁴ mol H-6 | 15 sec/250° F. | 0.24 | 4.81 |
| 5-3 | Permanax ™ + 1.25 × 10⁻⁴ mol H-6 | 19 sec/250° F. | 0.29 | 4.74 |
| 5-4 | Permanax ™ + 1.88 × 10⁻⁴ mol H-6 | 15 sec/250° F. | 0.27 | 4.78 |
| 5-5 | Permanax ™+ 0.50 × 10⁻³ mol H-4 | 15 sec/250° F. | 0.30 | 5.20 |
| 5-6 | Permanax ™ + 1.0 × 10⁻³ mol H-1 | 15 sec/250° F. | 0.22 | 4.66 |
| 5-7 | Permanax ™ + 1.0 × 10⁻³ mol H-1 | 19 sec/250° F. | 0.23 | 5.04 |
| 5-8 | Permanax ™ + 3.75 × 10⁻⁴ mol H-7 | 15 sec/250° F. | 0.24 | 5.10 |
| 5-9 | Permanax ™ 3.75 × 10⁻³ mol + H-7 | 19 sec/250° F. | 0.26 | 5.14 |
| 5-10 | Permanax ™ 2.50 × 10⁻⁴ mol + H-7 | 15 sec/250° F. | 0.22 | 4.79 |
| 5-11 | Permanax ™ 2.50 × 10⁻⁴ mol + H-7 | 19 sec/250° F. | 0.23 | 4.85 |
| 5-12 | Permanax ™ 1.25 × 10⁻⁴ mol + H-8 | 15 sec/250° F. | 0.26 | 4.48 |
| 5-13 | Permanax ™ 1.25 × 10⁻⁴ mol + H-8 | 19 sec/250° F. | 0.29 | 4.42 |
| 5-14 | Permanax ™ 1.88 × 10⁻⁴ mol + H-8 | 15 sec/250° F. | 0.29 | 4.97 |
| 5-15 | Permanax ™ 1.88 × 10⁻³ mol + H-8 | 19 sec/250° F. | 0.39 | 5.00 |
| 5-16 | Permanax ™ 6.25 × 10⁻⁵ mol + H-9 | 15 sec/250° F. | 0.49 | 4.68 |

| Ex. | Speed-2 | Speed-5 | Contrast-A | Contrast-D |
|---|---|---|---|---|
| 5-1 | 1.70 | 1.24 | 0.85 | 4.42 |
| 5-2 | 1.77 | 1.61 | 0.89 | 12.89 |
| 5-3 | 1.97 | 1.89 | 0.87 | 24.06 |
| 5-4 | 1.89 | 1.78 | 0.90 | 17.16 |
| 5-5 | 1.99 | 1.91 | 0.85 | 26.17 |
| 5-6 | 1.86 | 1.77 | 0.77 | 21.12 |
| 5-7 | 1.92 | 1.84 | 0.75 | 24.52 |
| 5-8 | 1.76 | 1.66 | 0.84 | 21.32 |
| 5-9 | 1.88 | 1.82 | 0.94 | 33.73 |
| 5-10 | 1.72 | 1.61 | 0.83 | 19.02 |
| 5-11 | 1.83 | 1.76 | 0.93 | 27.62 |
| 5-12 | 1.71 | 1.50 | 0.76 | 9.63 |
| 5-13 | 1.87 | 1.72 | 0.88 | 13.51 |
| 5-14 | 1.97 | 1.88 | 0.83 | 22.20 |
| 5-15 | 2.11 | 2.00 | 0.70 | 17.91 |
| 5-16 | 1.80 | 1.55 | 0.83 | 8.02 |

Example 6

Compounds H-10 or H-11 were added with PAZ at concentrations from 0.25×10⁻³ to 1.0×10⁻³ mol to the infrared sensitized silver premix of Formulation B. The coatings were coated, exposed and processed as described above.

The sensitometric responses for these photothermographic elements, shown below, demonstrate the enhanced contrast obtained by incorporation of trityl hydrazides to the photoactive silver containing a hindered phenol developer. The enhancement of the contrast with compound H-10 is similar to that observed in hard dot wet silver technology. The low solubility of compound H-11 prevented evaluation at higher concentrations.

| Ex. | Developer | Processing Conditions | Dmin | Dmax |
|---|---|---|---|---|
| 6-1 | Permanax™ + PAZ | 15 sec/250° F. | 0.25 | 4.64 |
| 6-2 | Permanax™ + PAZ + 0.25 × 10$^{-3}$ mol H-11 | 15 sec/250° F. | 0.25 | 3.89 |
| 6-3 | Permanax™ + PAZ 0.5 × 10$^{-3}$ mol H-11 | 15 sec/250° F. | 0.25 | 3.82 |
| 6-4 | Permanax™ + 0.5 × 10$^{-3}$ mol H-10 | 15 sec/250° F. | 0.22 | 4.20 |
| 6-5 | Permanax™ + 1.0 × 10$^{-3}$ mol H-10 | 15 sec/250° F. | 0.26 | 4.65 |

| Ex. | Speed-2 | Speed-5 | Contrast-A | Contrast-D |
|---|---|---|---|---|
| 6-1 | 1.53 | 1.09 | 0.90 | 4.65 |
| 6-2 | 1.56 | 1.04 | 0.78 | 3.84 |
| 6-3 | 1.61 | 1.26 | 0.85 | 5.79 |
| 6-4 | 1.63 | 1.46 | 0.99 | 12.16 |
| 6-5 | 1.73 | 1.64 | 0.84 | 22.31 |

Comparative Example

Compound C-1 was added to the infrared sensitized premix of Formulation B. The sensitometric response for this photothermographic element showed only an increase in Dmin, but no enhancement in contrast. It should be noted that removal of the carbonyl moiety (when compared to compound H-4) diminished the contrast effect.

Example 7

To 15.0 g aliquots of the silver premix described in Formulation E was added 1.5 g tetrahydrofuran and 1.28× 10$^{-3}$ moles of H-27 or 5.71×10$^{-4}$ moles of H-28 or 1.28× 10$^{-3}$ moles of H-12 or 8.5×10$^{-4}$ moles H-13.

Samples were imaged and developed as described above. The sensitometric results shown below, demonstrate the high contrast achieved with the addition of any of the trityl hydrazides as co-developers in the photothermographic element.

| Ex. | Developer | Processing Conditions | Dmin | Dmax |
|---|---|---|---|---|
| 7-1 | Permanax™ | 15 sec/250° F. | 0.20 | 4.73 |
| 7-2 | Permanax™ | 19 sec/250° F. | 0.22 | 4.63 |
| 7-3 | Permanax™ + 1.28 × 10$^{-3}$ mol H-27 | 15 sec/250° F. | 0.20 | 4.58 |
| 7-4 | Permanax™ + 1.28 × 10$^{-3}$ mol H-27 | 19 sec/250° F. | 0.22 | 4.35 |
| 7-5 | Permanax™ + 5.71 × 10$^{-4}$ mol H-28 | 15 sec/250° F. | 0.21 | 4.64 |
| 7-6 | Permanax™ + 5.71 × 10$^{-4}$ mol H-28 | 19 sec/250° F. | 0.23 | 4.49 |
| 7-7 | Permanax™ + 1.28 × 10$^{-3}$ mol H-12 | 15 sec/250° F. | 0.25 | 4.09 |
| 7-8 | Permanax™ + 1.28 × 10$^{-3}$ mol H-12 | 19 sec/250° F. | 0.34 | 4.09 |
| 7-9 | Permanax™ + 8.5 × 10$^{-4}$ mol H-13 | 15 sec/250° F. | 0.20 | 4.99 |
| 7-10 | Permanax™ + 8.5 × 10$^{-4}$ mol H-13 | 19 sec/250° F. | 0.22 | 5.12 |

| Ex. | Speed-2 | Speed-5 | Contrast-A | Contrast-D |
|---|---|---|---|---|
| 7-1 | 1.51 | 1.12 | 0.77 | 5.10 |
| 7-2 | 1.60 | 1.23 | 0.86 | 5.42 |
| 7-3 | 1.53 | 1.21 | 0.78 | 6.34 |
| 7-4 | 1.67 | 1.51 | 0.67 | 12.75 |
| 7-5 | 1.58 | 1.38 | 0.82 | 10.09 |
| 7-6 | 1.68 | 1.50 | 0.91 | 11.65 |
| 7-7 | 1.61 | 1.32 | 0.86 | 6.85 |
| 7-8 | 1.74 | 1.52 | 0.79 | 9.37 |
| 7-9 | 1.62 | 1.46 | 0.82 | 12.59 |
| 7-10 | 1.72 | 1.62 | 0.68 | 19.40 |

Example 8

As described above 1.0×10$^{-5}$, 1.5×10$^{-5}$, or 2.0×10$^{-5}$ moles of H-14, H-15, or H-16 were added to 15 g of the infrared sensitized silver premix solutions of Formulation B.

The effects on the sensitometric response by the addition of the formylphenyl hydrazines to the Permanax™ developer are summarized for the various processing conditions.

As shown by the examples below, addition of the formylphenyl hydrazines enhance contrast, speed, and Dmax of the photothermographic element and generate a sensitometric response in an infrared sensitized system similar to those observed for ultra high contrast hybrid wet silver halide technology.

| Ex. | Developer | Processing Conditions | Dmin | Dmax |
|---|---|---|---|---|
| 8-1 | Permanax™ | 15 sec/250° F. | 0.27 | 4.87 |
| 8-2 | Permanax™ | 19 sec/250° F. | 0.30 | 4.77 |
| 8-3 | Permanax™ + 1.0 × 10$^{-5}$ mol H-14 | 15 sec/250° F. | 0.29 | 5.01 |
| 8-4 | Permanax™ + 1.0 × 10$^{-5}$ mol H-14 | 19 sec/250° F. | 0.33 | 5.39 |
| 8-5 | Permanax™ + 1.5 × 10$^{-5}$ mol H-14 | 15 sec/250° F. | 0.30 | 5.36 |
| 8-6 | Permanax™ + 1.5 × 10$^{-5}$ mol H-14 | 19 sec/250° F. | 0.38 | 5.48 |
| 8-7 | Permanax™ + 2.0 × 10$^{-5}$ mol H-14 | 9 sec/250° F. | 0.30 | 5.29 |
| 8-8 | Permanax™ + 1.0 × 10$^{-5}$ mol H-15 | 15 sec/250° F. | 0.30 | 5.38 |
| 8-9 | Permanax™ + 1.0 × 10$^{-5}$ mol H-15 | 19 sec/250° F. | 0.36 | 5.44 |
| 8-10 | Permanax™ + 1.5 × 10$^{-5}$ mol H-15 | 9 sec/250° F. | 0.35 | 5.44 |
| 8-11 | Permanax™ + 1.0 × 10$^{-5}$ mol H-16 | 15 sec/250° F. | 0.31 | 4.62 |
| 8-12 | Permanax™ + 1.0 × 10$^{-5}$ mol H-16 | 19 sec/250° F. | 0.40 | 5.04 |
| 8-13 | Permanax™ + 1.5 × 10$^{-5}$ mol H-16 | 9 sec/250° F. | 0.33 | 5.41 |

| Ex. | Speed-2 | Speed-5 | Contrast-A | Contrast-D |
|---|---|---|---|---|
| 8-1 | 1.64 | 1.20 | 0.84 | 4.58 |
| 8-2 | 1.66 | 1.29 | 0.86 | 5.42 |
| 8-3 | 1.81 | 1.60 | 0.81 | 10.35 |
| 8-4 | 1.98 | 1.86 | 1.15 | 16.35 |
| 8-5 | 1.95 | 1.85 | 1.17 | 21.11 |
| 8-6 | 2.15 | 2.07 | 1.46 | 23.30 |
| 8-7 | 1.96 | 1.86 | 1.42 | 20.46 |
| 8-8 | 2.00 | 1.89 | 1.06 | 18.69 |
| 8-9 | 2.11 | 2.00 | 1.34 | 18.40 |
| 8-10 | 1.98 | 1.75 | 0.71 | 9.24 |
| 8-11 | 1.77 | 1.51 | 0.89 | 7.74 |
| 8-12 | 1.92 | 1.67 | 0.93 | 8.11 |
| 8-13 | 1.75 | 1.61 | 1.12 | 13.92 |

Comparative Example

As described in Example 8, 5.0×10$^{-5}$ or 6.25×10$^{-5}$ moles of methylphenylhydrazide C-2 was added to the infrared sensitized photothermographic coating solution.

The effects on the sensitometric response by the addition of the methyl phenyl hydrazide to the Permanax™ developer are summarized below and demonstrate that the replacement of the hydrogen in formyl-phenyl hydrazine H-14 with a methyl group as exemplified by compound C-2 completely diminishes the contrast enhancement effects observed with the formyl-phenyl hydrazine H-14.

| Ex. | Developer | Processing Conditions | Dmin | Dmax |
|---|---|---|---|---|
| C-8-1 | Permanax ™ | 15 sec/250° F. | 0.27 | 4.87 |
| C-8-2 | Permanax ™ | 19 sec/250° F. | 0.30 | 4.77 |
| C-8-3 | Permanax ™ + 5.0 × 10$^{-5}$ mole C-2 | 15 sec/250° F. | 0.31 | 4.89 |
| C-8-4 | Permanax ™ + 5.0 × 10$^{-5}$ mole C-2 | 19 sec/250° F. | 0.43 | 4.88 |
| C-8-5 | Permanax ™ + 6.25 × 10$^{-5}$ mole C-2 | 15 sec/250° F. | 0.39 | 4.84 |
| C-8-6 | Permanax ™ + 6.25 × 10$^{-5}$ mole C-2 | 19 sec/250° F. | 0.49 | 4.23 |

| Ex. | Speed-2 | Speed-5 | Contrast-A | Contrast-D |
|---|---|---|---|---|
| C-8-1 | 1.64 | 1.20 | 0.84 | 4.58 |
| C-8-2 | 1.66 | 1.29 | 0.68 | 5.42 |
| C-8-3 | 1.75 | 1.31 | 0.91 | 4.50 |
| C-8-4 | 1.87 | 1.37 | 0.71 | 3.99 |
| C-8-5 | 1.80 | 1.34 | 0.78 | 4.35 |
| C-8-6 | 1.88 | 0.95 | 0.97 | 2.15 |

Comparative Example

As described in Formulation B, 1.0×10$^{-5}$, 1.5×10$^{-5}$ or 2.0×10$^{-5}$ moles of the compound C-3, or 1.25×10$^{-5}$, 2.5×10$^{-5}$ or 5.0×10$^{-5}$ moles of compound C-4 were added to the infrared sensitized silver coating solution of Formulation B.

The sensitometric response for these materials, summarized below, demonstrates that at concentrations of 2.0×10$^{-5}$ moles of C-3 and 5.0×10$^{-5}$ moles of C-4, the coatings were fogged to Dmax at the 15sec/250° F. processing conditions. At shorter dwell times, no contrast enhancement was observed. As shown by the results, the replacement of the hydrogen of formyl-phenyl hydrazine H-14 with aryl groups in compounds C-3 and C-9 completely diminished the contrast enhancement effects.

| Ex. | Developer | Processing Conditions | Dmin | Dmax |
|---|---|---|---|---|
| C-8-7 | Permanax ™ | 15 sec/250° F. | 0.27 | 4.65 |
| C-8-8 | Permanax ™ | 19 sec/250° F. | 0.29 | 4.78 |
| C-8-9 | Permanax ™ + 1.0 × 10$^{-5}$ mol C-3 | 15 sec/250° F. | 0.33 | 4.69 |
| C-8-10 | Permanax ™ + 1.0 × 10$^{-5}$ mol C-3 | 19 sec/250° F. | 0.35 | 4.39 |
| C-8-11 | Permanax ™ + 1.5 × 10$^{-5}$ mol C-3 | 15 sec/250° F. | 0.53 | 4.57 |
| C-8-12 | Permanax ™ + 1.25 × 10$^{-5}$ mol C-4 | 15 sec/250° F. | 0.29 | 4.44 |
| C-8-13 | Permanax ™ + 1.25 × 10$^{-5}$ mol C-4 | 19 sec/250° F. | 0.34 | 4.33 |
| C-8-14 | Permanax ™ + 2.5 × 10$^{-5}$ mol C-4 | 15 sec/250° F. | 0.39 | 4.91 |
| C-8-15 | Permanax ™ + 2.5 × 10$^{-5}$ mol C-4 | 19 sec/250° F. | 0.46 | 4.78 |

| Ex. | Speed-2 | Speed-5 | Contrast-A | Contrast-D |
|---|---|---|---|---|
| C-8-7 | 1.60 | 1.18 | 0.95 | 4.80 |
| C-8-8 | 1.67 | 1.24 | 0.90 | 4.67 |
| C-8-9 | 1.68 | 1.19 | 0.76 | 4.09 |
| C-8-10 | 1.79 | 1.27 | 0.82 | 3.84 |
| C-8-11 | 1.71 | 1.18 | 0.59 | 3.80 |
| C-8-12 | 1.75 | 1.30 | 0.77 | 4.50 |
| C-8-13 | 1.84 | 1.29 | 0.83 | 3.58 |
| C-8-14 | 1.75 | 1.31 | 0.74 | 4.57 |
| C-8-15 | 1.86 | 1.36 | 0.67 | 3.95 |

Comparative Example

Compound C-5, 6.2×10$^5$ moles, 4.67×10$^5$ moles or 3.11×10$^{-5}$ moles was added to the infrared sensitized silver coating solution prepared in Formulation B.

The sensitometric response, shown below, demonstrates that substitution of the hydrogen adjacent to the carbonyl with a pyridinium methylene group completely diminishes contrast enhancement.

| Ex. | Developer | Processing Conditions | Dmin | Dmax |
|---|---|---|---|---|
| C-8-16 | Permanax ™ | 15 sec/250° F. | 0.27 | 4.60 |
| C-8-17 | Permanax ™ | 19 sec/250° F. | 0.29 | 4.50 |
| C-8-18 | Permanax ™ + 3.11 × 10$^{-5}$ mol C-5 | 15 sec/250° F. | 0.32 | 3.94 |
| C-8-19 | Permanax ™ + 3.11 × 10$^{-5}$ mol C-5 | 19 sec/250° F. | 0.37 | 3.65 |
| C-8-20 | Permanax ™ + 4.67 × 10$^{-5}$ mol C-5 | 9 sec/250° F. | Fogged | |
| C-8-21 | Permanax ™ + 6.20 × 10$^{-5}$ mol C-5 | 9 sec/250° F. | Fogged | |

| Ex. | Speed-2 | Speed-5 | Contrast-A | Contrast-D |
|---|---|---|---|---|
| C-8-16 | 1.55 | 1.14 | 0.93 | 4.91 |
| C-8-17 | 1.62 | 1.17 | 0.90 | 4.44 |
| C-8-18 | 1.47 | 0.91 | 0.64 | 3.65 |
| C-8-19 | 1.55 | 0.65 | 0.64 | 2.23 |
| C-8-20 | Fogged | | | |
| C-8-21 | Fogged | | | |

Example 9

The following example demonstrates that a developer system of both Permanax™ and formyl-phenyl hydrazine H-14 provides a high contrast photo-thermographic element.

Photothermographic elements were prepared incorporating Permanax™ alone and Permanax™ with 1.5×10$^{-5}$ moles of H-14 added to 15.0 g of red-sensitized Formulation C.

The sensitometric data, shown below, demonstrates the high contrast achieved by the addition of formyl-phenyl hydrazine H-14 to the red sensitized photothermographic silver emulsion.

| Ex. | Developer | Processing Conditions | Dmin | Dmax |
|---|---|---|---|---|
| 9-1 | Permanax ™ | 15 sec/250° F. | 0.12 | 4.18 |
| 9-2 | Permanax ™ + 1.5 × 10$^{-5}$ mol H-14 | 9 sec/250° F. | 0.13 | 5.06 |

| Ex. | Speed-2 | Speed-5 | Contrast-A | Contrast-D |
|---|---|---|---|---|
| 9-1 | 1.25 | 0.89 | 0.62 | 5.55 |
| 9-2 | 1.52 | 1.38 | 1.21 | 14.66 |

Example 10

To 15.0 g aliquots of the red-sensitized silver premix from Formulation D was added 2.56×10$^{-5}$ moles of H-14, or 1.28×10$^{-3}$ moles of H-10 or 8.49×10$^{-4}$ moles of H-4 and 1.5 g 2-butanone. The sensitometric responses for these coatings are shown below. As shown above, high contrast was achieved with these elements containing both hindered phenol developer and hydrazide co-developers.

| Ex. | Developer | Processing Conditions | Dmin | Dmax |
|---|---|---|---|---|
| 10-1 | Permanax ™ | 9 sec/250° F. | 0.09 | 3.25 |
| 10-2 | Permanax ™ | 15 sec/250° F. | 0.11 | 3.68 |
| 10-3 | Permanax ™ | 19 sec/250° F. | 0.13 | 3.88 |
| 10-4 | Permanax ™ + $2.56 \times 10^{-5}$ mol H-14 | 9 sec/250° F. | 0.13 | 5.20 |
| 10-5 | Permanax ™ + $2.56 \times 10^{-5}$ mol H-14 | 10 sec/250° F. | 0.15 | 5.23 |
| 10-6 | Permanax ™ + $1.28 \times 10^{-3}$ mol H-10 | 15 sec/250° F. | 0.11 | 4.46 |
| 10-7 | Permanax ™ + $1.28 \times 10^{-3}$ mol H-10 | 19 sec/250° F. | 0.13 | 4.47 |
| 10-8 | Permanax ™ + $8.49 \times 10^{-4}$ mol H-4 | 15 sec/250.° F. | 0.24 | 5.13 |
| 10-9 | Permanax ™ + $8.49 \times 10^{-4}$ mol H-4 | 19 sec/250° F. | Fogged | |

| Ex. | Speed-2 | Speed-5 | Contrast-A | Contrast-D |
|---|---|---|---|---|
| 10-1 | 0.85 | 0.44 | 0.66 | 4.82 |
| 10-2 | 1.08 | 0.64 | 0.84 | 4.47 |
| 10-3 | 1.16 | 0.70 | 0.73 | 4.34 |
| 10-4 | 1.37 | 1.23 | 1.12 | 16.51 |
| 10-5 | 1.47 | 1.36 | 1.10 | 17.49 |
| 10-6 | 1.17 | 1.08 | 0.73 | 23.14 |
| 10-7 | 1.28 | 1.22 | 0.66 | 31.51 |
| 10-8 | 1.45 | 1.34 | 0.51 | 18.87 |
| 10-9 | Fogged | | | |

Example 11

As described in Formulation B, a silver premix was made containing iridium doped ($1 \times 10^{-5}$ moles) core-shell emulsion homogenized to 19.1% in 2-butanone. The silver solution and topcoat were coated and dried as described in this formulation. To 15.0 g aliquots of the silver solution was added $1.0 \times 10^{-5}$ moles of hydrazide H-17.

The sensitometric response, shown below, demonstrates the high contrast achieved with these photothermographic elements containing both a hindered phenol developer and a hydrazide co-developer of this invention.

| Ex. | Developer | Processing Conditions | Dmin | Dmax |
|---|---|---|---|---|
| 11-1 | Permanax ™ | 7 sec/250° F. | 0.23 | 2.30 |
| 11-2 | Permanax ™ | 15 sec/250° F. | 0.25 | 5.11 |
| 11-3 | Permanax ™ + $1.0 \times 10^{-5}$ mol H-17 | 9 sec/250° F. | 0.24 | 5.13 |
| 11-4 | Permanax ™ + $1.0 \times 10^{-5}$ mol H-17 | 11 sec/250° F. | 0.29 | 5.35 |

| Ex. | Speed-2 | Speed-5 | Contrast-A | Contrast-D |
|---|---|---|---|---|
| 11-1 | 0.85 | — | 0.63 | — |
| 11-2 | 1.36 | 0.99 | 0.79 | 5.42 |
| 11-3 | 1.49 | 1.16 | 0.77 | 6.14 |
| 11-4 | 1.70 | 1.50 | 0.82 | 10.23 |

Example 12

To 15.0 g aliquots of the silver premix prepared as described in Example 11, were added 0.06 g of phthalazinone, 1.5 of methanol and $7.5 \times 10^{-5}$ moles H-18 or $2.5 \times 10^{-5}$ moles H-19.

The sensitometric response for these coatings, shown below, demonstrates the high contrast obtained when hydrazides within the scope of this invention are used as co-developers with a hindered phenol developer such as Permanax™.

| Ex. | Developer | Processing Conditions | Dmin | Dmax |
|---|---|---|---|---|
| 12-1 | Permanax ™ | 9 sec/250° F. | 0.17 | 4.38 |
| 12-2 | Permanax ™ | 19 sec/250° F. | 0.20 | 4.60 |
| 12-3 | Permanax ™ + $7.5 \times 10^{-6}$ mol H-18 | 9 sec/250° F. | 0.20 | 5.28 |
| 12-4 | Permanax ™ + $2.5 \times 10^{-5}$ mol H-19 | 15 sec/250° F. | 0.21 | 5.34 |
| 12-5 | Permanax ™ + $2.5 \times 10^{-5}$ mol H-19 | 19 sec/250° F. | 0.24 | 5.38 |

| Ex. | Speed-2 | Speed-5 | Contrast-A | Contrast-D |
|---|---|---|---|---|
| 12-1 | 1.38 | 0.76 | 0.81 | 3.25 |
| 12-2 | 1.62 | 1.25 | 0.88 | 5.37 |
| 12-3 | 1.87 | 1.75 | 1.05 | 16.36 |
| 12-4 | 1.87 | 1.77 | 1.18 | 19.34 |
| 12-5 | 1.92 | 1.81 | 1.38 | 17.95 |

Comparative Example

To 15.0 g aliquots of the silver premix described in Example 11 was added $1.0 \times 10^{-5}$ moles, or $1.5 \times 10^{-5}$ moles, or $2.0 \times 10^{-5}$ moles of C-6.

Samples were imaged and developed as described above. The sensitometric responses for these coatings are shown below and demonstrate that hydrazides outside this invention when used as co-developers with a hindered phenol developer such as Permanax™ tend to fog and provide little or no contrast enhancement.

| Ex. | Developer | Processing Conditions | Dmin | Dmax |
|---|---|---|---|---|
| C-12-1 | Permanax ™ | 15 sec/250° F. | 0.25 | 4.92 |
| C-12-2 | Permanax ™ + $1.0 \times 10^{-5}$ mol C-6 | 15 sec/250° F. | 0.26 | 4.85 |
| C-12-2 | Permanax ™ + $1.5 \times 10^{-5}$ mol C-6 | 15 sec/250° F. | 0.28 | 4.80 |
| C-12-4 | Permanax ™ + $2.0 \times 10^{-5}$ mol C-6 | 9 sec/250° F. | Fogged | |

| Ex. | Speed-2 | Speed-5 | Contrast-A | Contrast-D |
|---|---|---|---|---|
| C-12-1 | 1.38 | 0.96 | 0.74 | 4.89 |
| C-12-2 | 1.29 | 0.81 | 0.72 | 4.12 |
| C-12-3 | 1.43 | 0.97 | 0.74 | 4.37 |
| C-12-4 | | | Fogged | |

Example 13

To 15.0 g aliquots of the silver premix of in Formulation E was added 1.5 g of 2-butanone, $6.42 \times 10^{-4}$ moles of H-10 or $4.28 \times 10^{-4}$ moles of H-10; or $6.4 \times 10^{-6}$ moles of H-14, or $2.1 \times 10^{-6}$ moles of H-14; or $4.28 \times 10^{-4}$ moles of H-10+$2.1 \times 10^{-6}$ moles of H-14; or $4.28 \times 10^{-4}$ moles of H-10 +$6.4 \times 10^{6}$ moles of H-14; or $6.42 \times 10^{-4}$ moles of H-10+$2.1 \times 10^{-6}$ moles of H-14; or $6.42 \times 10^{-4}$ moles of H-10+$6.4 \times 10^{-6}$ moles H-14.

The sensitometric results for these coatings indicate that a combination of a trityl hydrazide and a formyl-phenyl hydrazine can produce high contrast at lower initial concentrations of either hydrazide used alone.

| Ex. | Developer | Processing Conditions | Dmin | Dmax |
|---|---|---|---|---|
| 13-1 | Permanax ™ + 4.28 × $10^{-4}$ mol H-10 | 15 sec/250° F. | 0.19 | 4.37 |
| 13-2 | Permanax ™ + 6.42 × $10^{-4}$ mol H-10 | 15 sec/250° F. | 0.20 | 4.46 |
| 13-3 | Permanax ™ + 2.1 × $10^{-6}$ mol H-14 | 15 sec/250° F. | 0.19 | 4.19 |
| 13-4 | Permanax ™ + 6.4 × $10^{-6}$ mol H-14 | 15 sec/250° F. | 0.21 | 4.78 |
| 13-5 | Permanax ™ + 4.28 × $10^{-4}$ mol H-10 + 2.1 × $10^{-6}$ mol H-14 | 15. sec/250° F. | 0.19 | 4.82 |
| 13-6 | Permanax ™ + 6.42 × $10^{-4}$ mol H-10 + 6.4 × $10^{-6}$ mol H-14 | 15 sec/250° F. | 0.21 | 5.35 |
| 13-7 | Permanax ™ + 4.28 × $10^{-4}$ mol H-10 + 6.4 × $10^{-6}$ mol H-14 | 15 sec/250° F. | 0.19 | 5.26 |
| 13-8 | Permanax ™ + 6.42 × $10^{-4}$ mol H-10 + 2.1 × $10^{-6}$ mol H-14 | 15 sec/250° F. | 0.21 | 5.26 |

| Ex. | Speed-2 | Speed-5 | Contrast-A | Contrast-D |
|---|---|---|---|---|
| 13-1 | 1.56 | 1.23 | 0.79 | 5.90 |
| 13-2 | 1.58 | 1.42 | 0.84 | 11.94 |
| 13-3 | 1.56 | 1.18 | 0.76 | 5.28 |
| 13-4 | 1.61 | 1.39 | 0.70 | 9.08 |
| 13-5 | 1.59 | 1.43 | 0.86 | 12.55 |
| 13-6 | 1.72 | 1.61 | 0.82 | 19.13 |
| 13-7 | 1.69 | 1.57 | 0.75 | 17.09 |
| 13-8 | 1.67 | 1.55 | 0.74 | 18.19 |

Example 14

To 15.0 g aliquots of the silver premix of Formulation E was added 1.5 g of tetrahydrofuran and 8.52×$10^{-4}$ moles of H-20, 4.26×$10^{-4}$ moles of H-21 or 1.28×$10^{-3}$ moles of H-22.

The sensitometric response for these coatings, shown below, demonstrates the high contrast obtained when hydrazides within the scope of this invention are incorporated in a photothermographic element.

| Ex. | Developer | Processing Conditions | Dmin | Dmax |
|---|---|---|---|---|
| 14-1 | Permanax ™ | 11 sec/250° F. | 0.18 | 3.68 |
| 14-2 | Permanax ™ | 15 sec/250° F. | 0.20 | 4.09 |
| 14-3 | Permanax ™ + 8.52 × $10^{-4}$ mol H-20 | 15 sec/250° F. | 0.22 | 5.38 |
| 14-3 | Permanax ™ + 4.26 × $10^{-4}$ mol H-21 | 11 sec/250° F. | 0.19 | 5.36 |
| 14-3 | Permanax ™ + 1.28 × $10^{-3}$ mol H-22 | 11 sec/250° F. | 0.20 | 5.35 |

| Ex. | Speed-2 | Speed-5 | Contrast-A | Contrast-D |
|---|---|---|---|---|
| 14-1 | 1.45 | 0.89 | 0.77 | 3.58 |
| 14-2 | 1.56 | 1.15 | 0.91 | 4.90 |
| 14-3 | 1.87 | 1.77 | 1.43 | 21.09 |
| 14-4 | 1.68 | 1.58 | 1.13 | 5.28 |
| 14-5 | 1.64 | 1.51 | 0.97 | 15.45 |

Example 15

To 15.0 g aliquots of the silver premix of Formulation E was added 1.5 g of tetrahydrofuran and 1.28×$10^{-4}$ moles of H-23 or 2.14×$10^{-4}$ moles of H-24.

The sensitometric results showed high contrast was achieved with the addition of either tritylhydrazide as co-developers in the photothermographic element. Also, the importance of the carbonyl group of compound H-24 in providing high contrast without fog is demonstrated when compared to compound C-10.

| Ex. | Developer | Processing Conditions | Dmin | Dmax |
|---|---|---|---|---|
| 15-1 | Permanax ™ | 15 sec/250° F. | 0.23 | 4.68 |
| 15-2 | Permanax ™ | 19 sec/250° F. | 0.26 | 4.28 |
| 15-3 | Permanax ™ + 1.28 × $10^{-4}$ mol H-23 | 15 sec/250° F. | 0.23 | 5.05 |
| 15-4 | Permanax ™ + 1.28 × $10^{-4}$ mol H-23 | 19 sec/250° F. | 0.28 | 5.26 |
| 15-5 | Permanax ™ + 2.14 × $10^{-4}$ mol H-24 | 15 sec/250° F. | 0.22 | 5.27 |
| 15-6 | Permanax ™ + 2.14 × $10^{-4}$ mol H-24 | 19 sec/250° F. | 0.26 | 5.33 |

| Ex. | Speed-2 | Speed-5 | Contrast-A | Contrast-D |
|---|---|---|---|---|
| 15-1 | 1.48 | 1.07 | 0.82 | 4.92 |
| 15-2 | 1.58 | 1.08 | 0.95 | 4.15 |
| 15-3 | 1.59 | 1.43 | 0.69 | 12.48 |
| 15-4 | 1.68 | 1.56 | 0.87 | 15.94 |
| 15-5 | 1.62 | 1.46 | 0.77 | 12.90 |
| 15-6 | 1.78 | 1.66 | 0.79 | 16.30 |

Comparative Example

As described in Example 15, 2.56×$10^{-5}$ moles, 4.27×$10^{-5}$ moles or 8.54×$10^{-5}$ moles of C-7 in 1.5 g of tetrahydrofuran were added to 15 g aliquots of the silver premix.

Samples were imaged and developed as described above. The sensitometric responses for these coatings are shown below and demonstrate that hydrazides outside this invention when used as co-developers with a hindered phenol developer, such as Permanax™, show no contrast enhancement.

| Ex. | Developer | Processing Conditions | Dmin | Dmax |
|---|---|---|---|---|
| C-15-1 | Permanax ™ | 15 sec/250° F. | 0.18 | 4.05 |
| C-15-2 | Permanax ™ + 2.56 × $10^{-5}$ mol C-7 | 15 sec/250° F. | 0.24 | 3.83 |
| C-15-3 | Permanax ™ + 4.27 × $10^{-5}$ mol C-7 | 15 sec/250° F. | 0.28 | 3.68 |
| C-15-3 | Permanax ™ + 8.54 × $10^{-5}$ mol C-7 | 9 sec/250° F. | Fogged | |

| Ex. | Speed-2 | Speed-5 | Contrast-A | Contrast-D |
|---|---|---|---|---|
| C-15-1 | 1.50 | 1.06 | 0.91 | 4.51 |
| C-15-2 | 1.57 | 0.84 | 0.59 | 2.78 |
| C-15-3 | 1.36 | 0.74 | 0.74 | 3.26 |
| C-15-4 | Fogged | | | |

Example 16

To 15.0 g aliquots of the silver premix described in Formulation E was added 1.5 g of tetrahydrofuran and 4.27×$10^{-4}$ moles H-25 or 2.15×$10^{-4}$ moles of H-26.

The sensitometric response for these coatings, shown below, demonstrates the high contrast obtained when hydrazides within the scope of this invention are incorporated in a photothermographic element.

| Ex. | Developer | Processing Conditions | Dmin | Dmax |
|---|---|---|---|---|
| 16-1 | Permanax ™ | 15 sec/250° F. | 0.22 | 4.48 |
| 16-2 | Permanax ™ + 4.27 × 10⁻⁴ mol H-25 | 15 sec/250° F. | 0.24 | 5.14 |
| 16-3 | Permanax ™ + 2.15 × 10⁻⁴ mol H-26 | 19 sec/250° F. | 0.22 | 5.06 |

| Ex. | Speed-2 | Speed-5 | Contrast-A | Contrast-D |
|---|---|---|---|---|
| 16-1 | 1.60 | 1.21 | 0.76 | 5.19 |
| 16-2 | 1.78 | 1.69 | 0.96 | 21.37 |
| 16-3 | 1.71 | 1.58 | 0.79 | 15.84 |

Example 17

The following example compares the use of hindered phenol developers With polyhydroxybenzene developers in photothermographic elements.

A silver premix of Formulation A was prepared as described in Example 2 above but omitted the addition of Permanax.™ To 14.6 g aliquots of the silver premix was added a solution of $1.1 \times 10^{-3}$ mol or $2.2 \times 10^{-3}$ mol of Permanax™ 1.5 g of tetrahydrofuran, $5.50 \times 10^{-4}$ mol or $1.09 \times 10^{-4}$ mol of hydroquinone in 1.5 g of tetrahydrofuran, or $5.50 \times 10^{-4}$ mol of CAO-5 in 1.5 g of tetrahydrofuran, or $5.50 \times 10^{-4}$ mol of pyrocatechol in 1.5 g of tetrahydrofuran, or $5.5 \times 10^{-4}$ mol of 1,4-di-t-butylhydroquinone in 1.5 g of tetrahydrofuran. The silver emulsion layer and topcoat layers were coated as described in Formulation A.

The sensitometric response, shown below, demonstrates that of polyhydroxybenzene developers (i.e., non-hindered phenol developers such as hydroquinone) are too reactive to obtain stable, usable images when processed even at a lower temperature. The hindered phenol developers provided good, stable, black-and-white images.

| Ex. | Developer | Processing Conditions | Dmin | Dmax |
|---|---|---|---|---|
| 17-1 | Permanax ™ 1.1 × 10⁻³ mol | 15 sec/250° F. | 0.34 | 4.84 |
| 17-2 | Permanax ™ 2.2 × 10⁻³ mol | 15 sec/250° F. | 0.39 | 4.95 |
| 17-3 | CAO-5 5.5 × 10⁻⁴ mol | 15 sec/250° F. | 0.32 | 4.57 |
| 17-4 | Pyrocatechol 5.5 × 10⁻⁴ mol | 15 sec/250° F. | fogged | |
| 17-5 | Pyrocatechol 5.5 × 10⁻⁴ mol | 15 sec/225° F. | fogged | |
| 17-6 | 1,4-di-t-butylhydroquinone 5.5 × 10⁻³ mol | 15 sec/250° F. | fogged | |
| 17-7 | 1,4-di-t-butylhydroquinone 5.5 × 10⁻³ mol | 15 sec/225° F. | fogged | |
| 17-8 | Hydroquinone 5.5 × 10⁻⁴ mol | 15 sec/250° F. | fogged | |
| 17-9 | Hydroquinone 1.09 × 10⁻⁴ mol | 15 sec/250° F. | 0.62 | 0.77 |

| Ex. | Speed-2 | Speed-5 | Contrast-A | Contrast-D |
|---|---|---|---|---|
| 17-1 | 1.77 | 1.16 | 0.63 | 3.30 |
| 17-2 | 2.12 | 1.57 | 0.62 | 3.64 |
| 17-3 | 1.95 | 1.23 | 0.64 | 2.80 |
| 17-4 | | | fogged | |
| 17-5 | | | fogged | |
| 17-6 | | | fogged | |
| 17-7 | | | fogged | |
| 17-8 | | | fogged | |
| 17-9 | | | faint image | |

Example 18

A dispersion of silver behenate full soap was prepared according to Formulation B but containing pre-formed Iridium-doped ($1 \times 10^{-5}$ moles) core-shell silver halide grains (0.042 μm, AgX=98%/2%, Br/I, 2 weight %; 1/4 I/Br core and 3/4 Br shell with 8% I in core) was homogenized to 19.1% solids in 2-butanone and toluene (99/1) and containing 2.2% Butvar™ B-79 resin. To 15.0 g aliquots of the dye sensitized silver premix of Formulation B was added 1.0× $10^{-3}$ mol of H-10, or $2.00 \times 10^{-5}$ mol of H-14; 0.06 g of PAZ and 1.5 g of tetrahydrofuran.

The sensitometric response, shown below, demonstrates the high contrast that can be obtained for photothermographic elements incorporating a hindered phenol developer and a trityl hydrazide or a formyl-phenyl hydrazine co-developer.

| Ex. | Developer | Processing Conditions | Dmin | Dmax |
|---|---|---|---|---|
| 18-1 | Permanax ™ | 15 sec/280° F. | 0.26 | 4.75 |
| 18-2 | Pennanax ™ | 19 sec/298° F. | 0.28 | 4.70 |
| 18-3 | Permanax ™ + 1.0 × 10⁻³ mol H-10 | 15 sec/280° F. | 0.28 | 5.00 |
| 18-4 | Permanax ™ + 1.0 × 10⁻³ mol H-10 | 19 sec/280° F. | 0.30 | 5.32 |
| 18-5 | Permanax ™ + 2.0 × 10⁻⁵ mol H-14 | 9 sec/280° F. | 0.27 | 5.22 |

| Ex. | Speed-2 | Speed-5 | Contrast-A | Contrast-D |
|---|---|---|---|---|
| 18-1 | 1.39 | 1.04 | 0.71 | 5.64 |
| 18-2 | 1.49 | 1.10 | 0.77 | 5.16 |
| 18-3 | 1.46 | 1.38 | 0.71 | 25.20 |
| 18-4 | 1.62 | 1.56 | 0.78 | 32.00 |
| 18-5 | 1.48 | 1.38 | 1.10 | 18.59 |

The above film samples were then exposed using an imagesetter containing a 780 nm laser diode light source. A 150 line/inch halftone test pattern containing dots from 1–99% and 4-point Times-Roman type font was imaged onto the film with 400–1000 ergs/cm². Using the same processing conditions described above, sharper edge dots and a broader dot range were observed for the hydrazide containing elements when compared with elements containing only Permanax™ The 4-point type font also appeared sharper in the hydrazide containing elements than in the Permanax™ containing elements. Additionally, a Dmax greater than 5 was achieved in the hydrazide containing elements.

Reasonable modifications and variations are possible from the foregoing disclosure without departing from either the spirit or scope of the present invention as defined by the claims.

What is claimed is:

1. A process comprising the steps of:
   (a) exposing a heat-developable, photothermographic element to light and thereafter heating said element to form a visible image thereon;

(b) positioning said element with a visible image thereon between a source of ultraviolet or short wavelength visible radiation and an ultraviolet or short wavelength visible radiation photosensitive imageable medium; and (c) then exposing said ultraviolet or short wavelength visible radiation sensitive imageable medium to ultraviolet or short wavelength visible radiation through said visible image on said element, thereby absorbing ultraviolet or short wavelength visible radiation in the areas of said element where there is a visible image and transmitting ultraviolet or short wavelength visible radiation where there is no visible image on said element;

said heat-developable, photothermographic element comprising:

(i) a photosensitive silver halide;

(ii) a non-photosensitive, reducible silver source;

(iii) a reducing system for said non-photosensitive, reducible silver source;

(iv) a binder; and (v) a support;

wherein said reducing system consists essentially of at least one hindered phenol and at least one co-developer of the formula:

$$R^1-(C=O)-NHNH-R^2$$

wherein:

$R^1$ represents hydrogen and $R^2$ represents an aryl or substituted aryl group; or, $R^1$ represents hydrogen, alkyl, or alkenyl groups of up to 20 carbon atoms; alkoxy, thioalkoxy, or amido groups of up to 20 carbon atoms; aryl, alkaryl, or aralkyl groups of up to 20 carbon atoms; aryloxy, thioaryloxy or anilino groups of up to 20 carbon atoms; aliphatic or aromatic heterocyclic ring groups containing up to 6 ring atoms; carbocyclic ring groups comprising up to 6 ring carbon atoms; or fused ring or bridging groups comprising up to 14 ring atoms; and $R^2$ represents a trityl group.

2. The process of claim 1 wherein said imageable medium is a resist developable, ultraviolet or short wavelength visible radiation sensitive imageable medium.

3. The process of claim 1 wherein said exposing of said element in step (a) is done with a red or infrared emitting laser or red or infrared emitting laser diode.

4. The process of claim 1 wherein said ultraviolet or short wavelength visible radiation sensitive imageable medium is a printing plate, a contact proof, or a duplicating film.

5. A process comprising the steps of:

(a) heating a heat-developable thermographic element to form a visible image thereon;

(b) positioning said element with a visible image thereon between a source of ultraviolet or short wavelength visible radiation and an ultraviolet or short wavelength visible radiation photosensitive imageable medium; and (c) then exposing said ultraviolet or short wavelength visible radiation sensitive imageable medium to ultraviolet or short wavelength visible radiation through said visible image on said element, thereby absorbing ultraviolet or short wavelength visible radiation in the areas of said element where there is a visible image and transmitting ultraviolet or short wavelength visible radiation where there is no visible image on said element;

said heat-developable, thermographic element comprising:

(i) a non-photosensitive, reducible silver source;

(ii) a reducing system for said non-photosensitive, reducible silver source;

(iii) a binder; and (iv) a support;

wherein said reducing system consists essentially of at least one hindered phenol and at least one co-developer of the formula:

$$R^1-(C=O)-NHNH-R^2$$

wherein:

$R^1$ represents hydrogen and $R^2$ represents an aryl or substituted aryl group; or, $R^1$ represents hydrogen, alkyl, or alkenyl groups of up to 20 carbon atoms; alkoxy, thioalkoxy, or amido groups of up to 20 carbon atoms; aryl alkaryl, or aralkyl groups of up to 20 carbon atoms; aryloxy, thioaryloxy, or anilino groups of up to 20 carbon atoms; aliphatic or aromatic heterocyclic ring groups containing up to 6 ring atoms; carbocyclic ring groups comprising up to 6 ring carbon atoms; or feed ring or bridging groups comprising up to 14 ring atoms; and $R^2$ represents a trityl group.

6. The process of claim 5 wherein said imageable medium is a resist developable, ultraviolet or short wavelength visible radiation sensitive imageable medium.

7. The process of claim 5 wherein said heating of the element is done with a red or infrared emitting laser or red or infrared emitting laser diode.

8. The process of claim 5 wherein said ultraviolet or short wavelength visible radiation sensitive imageable medium is a printing plate, a contact print film, or a duplicating film.

* * * * *